United States Patent
Ito et al.

(10) Patent No.: US 10,852,529 B2
(45) Date of Patent: Dec. 1, 2020

(54) MIRROR DRIVING APPARATUS AND METHOD FOR MANUFACTURING THEREOF

(71) Applicant: Mitsubishi Electric Corporation, Chiyoda-ku (JP)

(72) Inventors: Takahiko Ito, Chiyoda-ku (JP); Nobuaki Konno, Chiyoda-ku (JP); Yoshiaki Hirata, Chiyoda-ku (JP); Yukihisa Yoshida, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 249 days.

(21) Appl. No.: 16/065,862

(22) PCT Filed: Dec. 13, 2016

(86) PCT No.: PCT/JP2016/086986
§ 371 (c)(1),
(2) Date: Jun. 25, 2018

(87) PCT Pub. No.: WO2017/141529
PCT Pub. Date: Aug. 24, 2017

(65) Prior Publication Data
US 2020/0081243 A1    Mar. 12, 2020

(30) Foreign Application Priority Data

Feb. 17, 2016  (JP) ................................. 2016-028031

(51) Int. Cl.
*G02B 26/08*   (2006.01)
*G02B 26/10*   (2006.01)
(Continued)

(52) U.S. Cl.
CPC ........ *G02B 26/0841* (2013.01); *B81B 3/0035* (2013.01); *G02B 6/352* (2013.01); *G02B 26/0858* (2013.01); *B81B 2201/042* (2013.01)

(58) Field of Classification Search
CPC ............ G02B 26/0841; G02B 26/0858; G02B 26/101; G02B 26/105; G02B 26/0833;
(Continued)

(56) References Cited

U.S. PATENT DOCUMENTS 6,681,063 B1 * 1/2004  Kane .................... G02B 6/3578
                                                           359/224.1
2006/0133724 A1    6/2006  Huang et al.
(Continued)

FOREIGN PATENT DOCUMENTS

JP         1-276114 A       11/1989
JP         2-94578 A         4/1990
(Continued)

OTHER PUBLICATIONS

International Search Report dated Mar. 14, 2017 in PCT/JP2016/086986 filed Dec. 13, 2016.
(Continued)

*Primary Examiner* — William R Alexander
*Assistant Examiner* — Tamara Y. Washington
(74) *Attorney, Agent, or Firm* — Xsensus LLP

(57) ABSTRACT

In a mirror driving apparatus, a pair of beam portions includes: a pair of first beams directly adjacent to a reflector to sandwich the reflector between the first beams; and a pair of second beams each coupled to one side of a corresponding one of the first beams, the one side being opposite to the reflector with respect to the corresponding one of the first beams. A plurality of electrodes are spaced from each other on a main surface of each of the first beams, a piezoelectric material being interposed between the main surface and the (Continued)

plurality of electrodes. The first beams are displaceable crosswise to the main surface in respective directions opposite to each other. The pair of second beams is displaceable in a direction connecting the first beams and the second beams, along the main surface of the second beams.

<center>5 Claims, 17 Drawing Sheets</center>

(51) Int. Cl.
*G02B 26/12* (2006.01)
*B81B 3/00* (2006.01)
*G02B 6/35* (2006.01)

(58) Field of Classification Search
CPC ............ G02B 26/085; B81B 2201/042; B81B 2203/0109; B81B 2203/0154; B81B 2203/058; B81B 3/0062
USPC ....................................................... 359/224.1
See application file for complete search history.

(56) References Cited

U.S. PATENT DOCUMENTS

| 2008/0023552 | A1* | 1/2008 | Gillet | G02B 26/0841 |
| | | | | 235/462.36 |
| 2010/0014140 | A1* | 1/2010 | Akedo | G02B 26/105 |
| | | | | 359/199.1 |
| 2010/0014142 | A1* | 1/2010 | Akedo | G02B 26/105 |
| | | | | 359/224.1 |
| 2010/0079837 | A1* | 4/2010 | Akedo | G02B 26/105 |
| | | | | 359/224.1 |
| 2010/0195180 | A1 | 8/2010 | Akanuma et al. | |
| 2010/0309536 | A1* | 12/2010 | Akanuma | G02B 26/0858 |
| | | | | 359/200.8 |
| 2012/0008185 | A1* | 1/2012 | Park | G02B 26/0841 |
| | | | | 359/213.1 |
| 2012/0194890 | A1* | 8/2012 | Park | G02B 26/0858 |
| | | | | 359/199.1 |
| 2013/0278984 | A1* | 10/2013 | Honda | G02B 26/105 |
| | | | | 359/199.1 |
| 2014/0300942 | A1* | 10/2014 | Van Lierop | B81B 3/007 |
| | | | | 359/199.2 |
| 2014/0339658 | A1* | 11/2014 | Gu-Stoppel | B81C 1/00357 |
| | | | | 257/418 |
| 2015/0022871 | A1 | 1/2015 | Naono | |
| 2017/0199375 | A1* | 7/2017 | Naono | G02B 26/08 |
| 2017/0205624 | A1* | 7/2017 | Naono | B81B 3/0043 |

FOREIGN PATENT DOCUMENTS

| JP | 2008197140 | * | 2/2007 | ............ 359/292 |
| JP | 2010-197994 | A | 9/2010 | |
| JP | 2014-534461 | A | 12/2014 | |
| JP | 2015-22064 | A | 2/2015 | |
| WO | WO 03/062899 | A1 | 7/2003 | |
| WO | WO 2013/105507 | A1 | 7/2013 | |

OTHER PUBLICATIONS

Japanese Office Action dated Jul. 5, 2017 in JP 2017-531922 (with English translation).

* cited by examiner

MIRROR DRIVING APPARATUS AND METHOD FOR MANUFACTURING THEREOF

TECHNICAL FIELD

The present invention relates to a mirror driving apparatus, a method for controlling a mirror driving apparatus, and a method for manufacturing a mirror driving apparatus. In particular, the present invention relates to a mirror driving apparatus for changing the reflection direction and the focus position of incident light to be used for information communication or distance measurement.

BACKGROUND ART

A mirror driving apparatus for changing the reflection direction and the focus position of light incident on a mirror by causing bending deformation of a beam supporting the mirror to thereby change the posture and the displacement of the mirror has been known. For example, WO2003/062899 (Patent Document 1) discloses an optical switch in which a mirror device and piezoelectric elements made up of piezoelectric thin films, electrodes, and elastic members, are formed on a substrate. A voltage is applied to the electrodes to cause flexure deformation of the piezoelectric thin films, which causes the mirror device to rotate about the rotational axis. The mirror device is thus driven.

CITATION LIST

Patent Document

PTD 1: WO2003/062899

SUMMARY OF INVENTION

Technical Problem

In the optical switch of WO2003/062899, a strain absorber connects the mirror device to the elastic member. In this optical switch, different voltages are applied to respective piezoelectric thin films so as to drive the mirror device. In this case, particularly if a beam on which the piezoelectric thin film is mounted and the mirror device are formed as a single unit by a technology such as MEMS (Micro Electro Mechanical Systems) technology, stress is easily exerted on the mirror device when the optical switch is driven, which could result in deterioration of the flatness of the mirror device. This is due to the action of the strain absorber disposed between the beam and the mirror device for connecting the beam and the mirror device together. Deterioration of the flatness of the mirror device could degrade the properties of light reflected from the mirror device.

The present invention has been made in view of the above problem. An object of the present invention is to provide a mirror driving apparatus that can suppress deterioration of the flatness of the mirror device by reducing stress between the mirror device and the beam on which the piezoelectric material is mounted, even when the beam and the mirror device are formed as a single unit, as well as a method for controlling the mirror driving apparatus and a method for manufacturing the mirror driving apparatus.

Solution to Problem

A mirror driving apparatus of the present invention includes a reflector and a pair of beam portions. The reflector is capable of reflecting incident light. The pair of beam portions is adjacent to the reflector to sandwich the reflector between the beam portions as seen in plan view. The pair of beam portions includes: a pair of first beams directly adjacent to the reflector to sandwich the reflector between the first beams; and a pair of second beams each coupled to one side of a corresponding one of the first beams, the one side being opposite to the reflector with respect to the corresponding one of the first beams. A plurality of electrodes are spaced from each other on a main surface of each of the pair of first beams, a piezoelectric material being interposed between the main surface and the plurality of electrodes. The first beams of the pair of first beams are displaceable crosswise to the main surface in respective directions opposite to each other. First boundary portions directly adjacent to the reflector and directly adjacent to the pair of first beams are displaceable crosswise to the main surface, and the pair of first beams is smaller in width than the reflector. The pair of second beams is displaceable in a direction connecting the pair of first beams and the pair of second beams, along a main surface of the second beams. Respective voltages of opposite polarities are applicable to a first electrode and a second electrode of the plurality of electrodes, the first electrode being located at a smaller distance from the reflector than a distance between the second electrode and the reflector, the second electrode being adjacent to the first electrode. The reflector is configured to be inclined about an axis by deformation of the piezoelectric material caused by the voltages, the axis being orthogonal to a line connecting the reflector and the first boundary portions between the reflector and the pair of first beams. Respective voltages identical in absolute value and opposite in polarity to each other are applied to the first electrode for one first beam of the pair of first beams and the first electrode for the other first beam of the pair of first beams, the one first beam being different from the other first beam. Respective voltages identical in absolute value and opposite in polarity to each other are applied to the second electrode for the one first beam of the pair of first beams and the second electrode for the other first beam of the pair of first beams. A plurality of rows each including the pair of first beams and the pair of second beams are arranged. A first row and a second row that are included in the plurality of rows are arranged to cross each other as seen in plan view.

According to a method for manufacturing a mirror driving apparatus of the present invention, a reflector capable of reflecting incident light is formed. A pair of beam portions adjacent to the reflector to sandwich the reflector between the beam portions as seen in plan view is formed. The pair of beam portions includes: a pair of first beams directly adjacent to the reflector to sandwich the reflector between the first beams; and a pair of second beams each coupled to one side of a corresponding one of the first beams, the one side being opposite to the reflector with respect to the corresponding one of the first beams. A plurality of electrodes are spaced from each other on a main surface of each of the pair of first beams, a piezoelectric material being interposed between the main surface and the plurality of electrodes. The first beams of the pair of first beams are displaceable crosswise to the main surface in respective directions opposite to each other. First boundary portions directly adjacent to the reflector and directly adjacent to the pair of first beams are displaceable crosswise to the main surface, and the pair of first beams is smaller in width than the reflector. The pair of second beams is displaceable in a direction connecting the pair of first beams and the pair of second beams, along a main surface of the second beams.

Respective voltages of opposite polarities are applicable to a first electrode and a second electrode of the plurality of electrodes, the first electrode being located at a smaller distance from the reflector than a distance between the second electrode and the reflector, the second electrode being adjacent to the first electrode. The reflector is configured to be inclined about an axis by deformation of the piezoelectric material caused by the voltages, the axis being orthogonal to a line connecting the reflector and the first boundary portions between the reflector and the pair of first beams. Respective voltages identical in absolute value and opposite in polarity to each other are applied to the first electrode for one first beam of the pair of first beams and the first electrode for the other first beam of the pair of first beams, the one first beam being different from the other first beam. Respective voltages identical in absolute value and opposite in polarity to each other are applied to the second electrode for the one first beam of the pair of first beams and the second electrode for the other first beam of the pair of first beams. A plurality of rows each including the pair of first beams and the pair of second beams are arranged. A first row and a second row that are included in the plurality of rows are arranged to cross each other as seen in plan view.

Advantageous Effects of Invention

According to the present invention, the first beams located relatively closer to the reflector are displaceable crosswise to the main surface of the first beams, while the second beams are displaceable in the direction connecting the first beams and the second beams, along the main surface of the second beams. Stress between the reflector and the first beams connected to the reflector can therefore be reduced and accordingly deterioration of the flatness of the reflector can be suppressed.

DESCRIPTION OF EMBODIMENTS

In the following, embodiments of the present invention are described based on the drawings.

Embodiment 1

Figure 1:
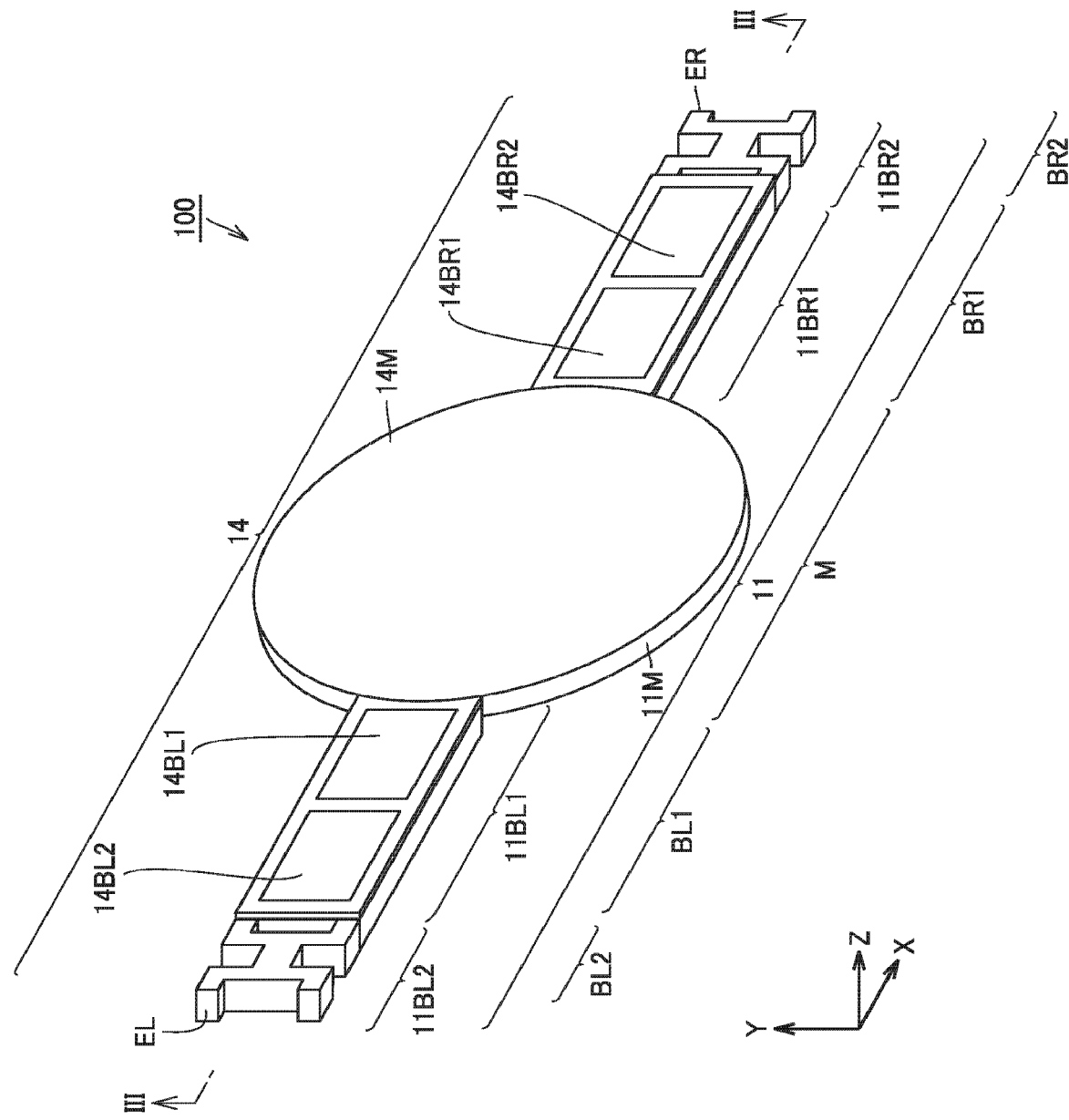
FIG. 1 is a perspective view showing an overall configuration of a mirror driving apparatus in a first example of Embodiment 1.

A description is given, using FIGS. 1 to 4, of a configuration of a mirror driving apparatus in a first example of the present embodiment. For the sake of convenience of description, X direction, Y direction, and Z direction are used. In FIG. 1, the width in the Y direction of a beam is drawn wider relative to other drawings for the sake of ease of visual recognition. In FIGS. 1 to 4, the X direction is a direction connecting a reflective mirror portion M to first beam portions BL1, BR1 and second beam portions BL2, BR2. In the X direction, first beam portions BL1, BR1 and second beam portions BL2, BR2 extend. The Y direction is orthogonal to the X direction as seen in plan view. Specifically, the Y direction crosses the direction in which first beam portions BL1, BR1 and second beam portions BL2, BR2 extend. The Z direction is a direction in which electrodes 12BL1, 14BL1 and a piezoelectric film 13BL1 are stacked on a first beam 11BL1 of first beam portion BL1.

Figure 2:
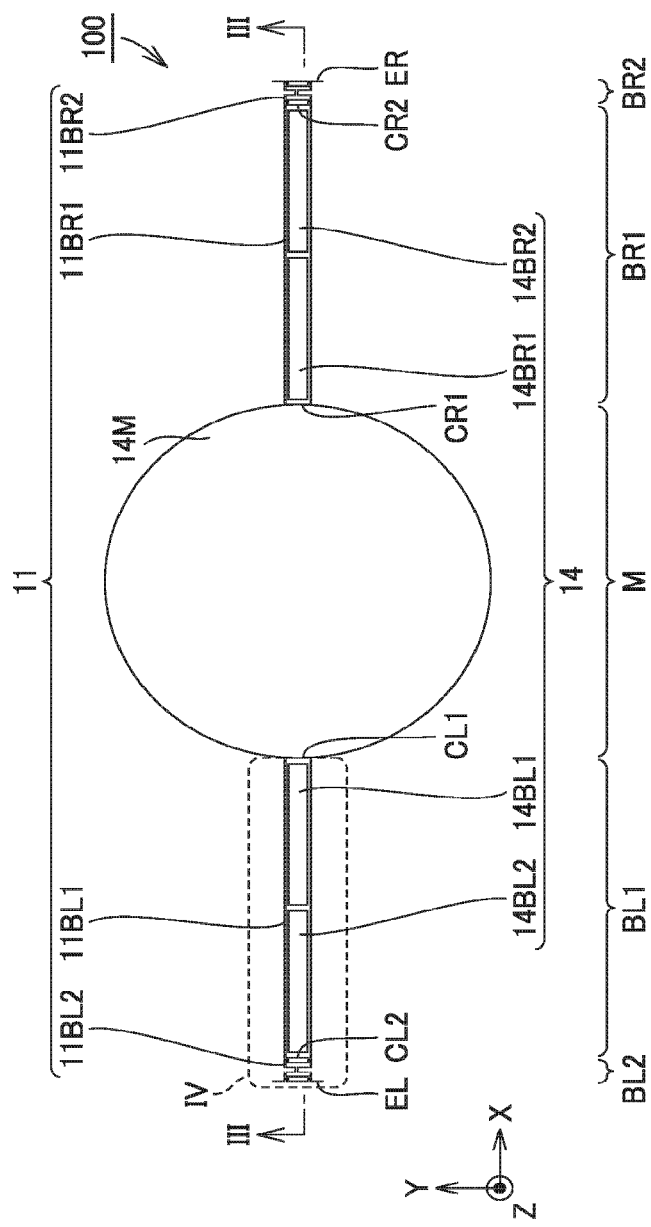
FIG. 2 is a schematic plan view showing the overall configuration of the mirror driving apparatus in the first example of Embodiment 1.
Figure 3:
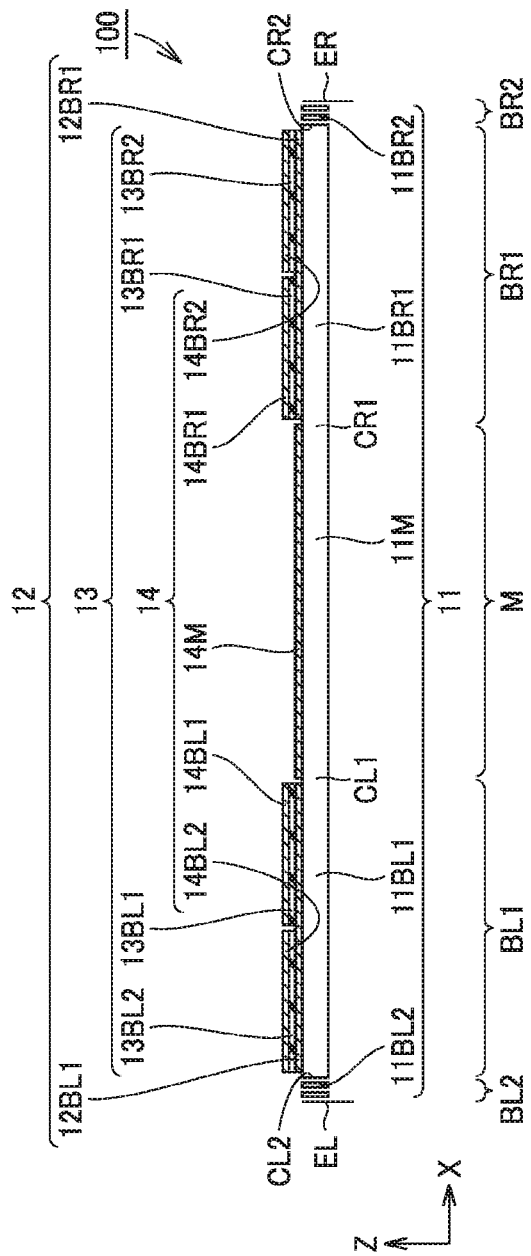
FIG. 3 is a schematic cross-sectional view along line III-III in FIG. 2.

Referring to FIGS. 1, 2, and 3, a mirror driving apparatus 100 in the first example of the present embodiment mainly includes a reflective mirror portion M, a pair of first beam portions BL1, BR1 (a pair of beam portions), and a pair of second beam portions BL2, BR2 (a pair of beam portions). First beam portion BL1 which is one of the pair of first beam portions is located adjacent to the left side, in the X direction in FIGS. 1, 2, and 3, of reflective mirror portion M. First beam portion BR1 which is the other of the pair of first beam portions is located adjacent to the right side, in the X direction in FIGS. 1, 2, and 3, of reflective mirror portion M. Likewise, second beam portion BL2 which is one of the pair of second beam portions is located adjacent to the left side, in the X direction in FIGS. 1, 2, and 3, of first beam portion BL1, i.e., located away from reflective mirror portion M. Second beam portion BR2 which is the other of the pair of second beam portions is located adjacent to the right side, in the X direction in FIGS. 1, 2, and 3, of first beam portion BR1, i.e., located away from reflective mirror portion M.

Reflective mirror portion M, the pair of first beam portions BL1, BR1, and the pair of second beam portions BL2, BR2 are each made up of a beam 11, a lower electrode 12, a piezoelectric film 13, and an upper electrode 14. A description is given first of a manner in which beam 11, lower electrode 12, piezoelectric film 13, and upper electrode 14 are arranged.

Beam 11 is supported by a left end EL and a right end ER that are respectively a left side end and a right side end in the X direction in FIGS. 1, 2 and 3, and extends linearly in the X direction between left end EL and right end ER. Herein, beam 11 in reflective mirror portion M is a reflective mirror 11M, respective portions of beam 11 in the pair of first beam portions BL1, BR1 are first beams 11BL1, 11BR1, and respective portions of beam 11 in the pair of second beam portions BL2, BR2 are second beams 11BL2, 11BR2. Beam 11 is therefore made up of reflective mirror 11M, a pair of first beams 11BL1, 11BR1, and a pair of second beams 11BL2, 11BR2.

Reflective mirror 11M of reflective mirror portion M is formed as a reflector capable of reflecting incident light, like a common mirror. Lower electrode 12 is a thin-film electrode formed on a main surface of each of the pair of first beams 11BL1, 11BR1, and has a rectangular shape as seen in plan view, for example. The main surface of each of first beams 11BL1, 11BR1 is the surface of first beams 11BL1, 11BR1 that extends along the XY plane and faces upward along the Z direction. Lower electrode 12 on the main surface of first beam 11BL1 is a lower electrode 12BL1, and lower electrode 12 on the main surface of first beam 11BR1 is a lower electrode 12BR1. Lower electrode 12 thus includes lower electrode 12BL1 of first beam portion BL1 and lower electrode 12BR1 of second first beam portion BR1.

Piezoelectric film 13 is a thin-film member formed on the main surfaces of lower electrodes 12BL1, 12BR1 that face upward along the Z direction and formed to overlap lower electrodes 12BL1, 12BR1, and has a rectangular shape as seen in plan view, for example. Piezoelectric film 13 on the main surface of lower electrode 12BL1 is piezoelectric films 13BL1, 13BL2. Piezoelectric film 13BL1 is located at a shorter distance from reflective mirror portion M relative to the distance between piezoelectric film 13BL2 and reflective minor portion M, and piezoelectric film 13BL1 and piezoelectric film 13BL2 are spaced from each other. Piezoelectric film 13 on the main surface of lower electrode 12BR1 is piezoelectric films 13BR1, 13BR2. Piezoelectric film 13BR1 is located at a shorter distance from reflective mirror portion M relative to the distance between piezoelectric film 13BR2 and reflective mirror portion M, and piezoelectric films 13BR1 and 13BR2 are spaced from each other. Piezoelectric film 13 thus includes a pair of piezoelectric films 13BL1, 13BL2 of first beam portion BL1, and a pair of piezoelectric films 13BR1, 13BR2 of first beam portion BR1.

Upper electrode 14 is a thin-film electrode formed to overlap the main surfaces of piezoelectric films 13BL1, 13BL2, 13BR1, 13BR2 that face upward along the Z direction, and have a rectangular shape as seen in plan view, for example. Upper electrode 14 formed directly on piezoelectric films 13BL1, 13BL2, 13BR1, 13BR2 is upper electrodes 14BL1, 14BL2, 14BR1, 14BR2. Upper electrode 14BL1 and upper electrode 14BL2 are spaced from each other, and upper electrode 14BR1 and upper electrode 14BR2 are spaced from each other. Upper electrode 14 thus includes a pair of upper electrodes 14BL1, 14BL2 of first beam portion BL1 and a pair of upper electrodes 14BR1, 14BR2 of first beam portion BR1.

A reflective film 14M is formed on the main surface, which faces upward along the Z direction, of reflective mirror 11M corresponding to beam 11 in reflective mirror portion M. Reflective film 14M is the same layer and made from the same material and at the same time as upper electrodes 14BL1, 14BL2, 14BR1, 14BR2. Reflective film 14M is formed on the main surface, which faces upward along the Z direction, of reflective mirror 11M, in order to enhance the function of reflecting incident light, as a mirror of reflective mirror 11M.

A description is now given, from a different point of view from the above, of the configuration of reflective mirror portion M, the pair of first beam portions BL1, BR1, and the pair of second beam portions BL2, BR2.

Referring again to FIGS. 2 and 3, in reflective mirror portion M disposed in a central portion with respect to the X direction, reflective mirror 11M as a part of beam 11 and reflective film 14M on the main surface of reflective mirror 11M are stacked in this order. Reflective mirror 11M and reflective film 14M have a circular shape as seen in plan view, for example.

First beam portion BL1 is disposed on the left side, in the X direction, of reflective mirror portion M. First beam 11BL1 is thus adjacent to reflective mirror 11M in one direction from reflective mirror 11M, i.e., adjacent to the left side, in the X direction, of reflective mirror 11M, as seen in plan view. In first beam portion BL1, first beam 11BL1 as a part of beam 11, lower electrode 12BL1, a pair of piezoelectric films 13BL1, 13BL2, and a pair of upper electrodes 14BL1, 14BL2 are stacked in this order. Both piezoelectric film 13BL1 and piezoelectric film 13BL2 are stacked on lower electrode 12BL1. On piezoelectric film 13BL1, upper electrode 14BL1 having a shape and an area substantially identical to those of piezoelectric film 13BL1 is stacked. On piezoelectric film 13BL2, upper electrode 14BL2 having a shape and an area substantially identical to those of piezoelectric film 13BL2 are stacked. The area of upper electrode 14BL1/14BL2 is therefore approximately a half of the area of lower electrode 12BL1.

First beam portion BR1 is disposed on the right side, in the X direction, of reflective mirror portion M. First beam 11BR1 is thus adjacent to reflective mirror 11M in the other opposite direction from reflective mirror 11M, i.e., adjacent to the right side, in the X direction, of reflective mirror 11M, as seen in plan view. In first beam portion BR1, first beam 11BR1 as a part of beam 11, lower electrode 12BR1, a pair of piezoelectric films 13BR1, 13BR2, and a pair of upper electrodes 14BR1, 14BR2 are stacked in this order. The relation in shape and area between electrodes for example is similar to that between corresponding electrodes in first beam portion BL1. In this way, a pair of beam portions adjacent to reflective mirror 11M that are specifically first beam portion BL1 and first beam portion BR1 as well as second beam portion BL2 and second beam portion BR2 are arranged, with reflective mirror 11M sandwiched between the beam portions in the X direction as seen in plan view.

In this way, a pair of first beams 11BL1, 11BR1 is formed. Over the main surface of first beam 11BL1, upper electrodes 14BL1, 14BL2 as a plurality of electrodes are spaced from each other with piezoelectric films 13BL1, 13BL2 as a piezoelectric material interposed therebetween. While two upper electrodes 14BL1, 14BL2 are formed as a plurality of electrodes, the number of the electrodes is not limited to this and three or more upper electrodes 14 may be formed. Likewise, over the main surface of first beam 11BR1, upper electrodes 14BR1, 14BR2 as a plurality of electrodes are spaced from each other with piezoelectric films 13BR1, 13BR2 as a piezoelectric material interposed therebetween. Over first beam 11BR1, three or more upper electrodes 14 may be formed.

Second beam portion BL2 is disposed on the left side of first beam portion BL1 in the X direction, and second beam portion BR2 is disposed on the right side of first beam portion BR1 in the X direction. Accordingly, second beams 11BL2, 11BR2 are adjacent to first beams 11BL1, 11BR1 respectively and located away from reflective mirror 11M as seen in plan view. Specifically, second beam 11BL2 is located on the left side of first beam 11BL1 away from reflective mirror portion M in the X direction, and second beam 11BR2 is located on the right side of first beam 11BR1 away from reflective mirror portion M in the X direction.

Thus, the pair of beam portions adjacent to reflective mirror 11M includes the pair of first beams 11BL1, 11BR1 and the pair of second beams 11BL2, 11BR2. First beams 11BL1, 11BR1 are directly adjacent to reflective mirror 11M to sandwich reflective mirror 11M between the first beams. Second beams 11BL2, 11BR2 are coupled to the opposite sides, to reflective mirror 11M, of first beams 11BL1, 11BR1.

Beam 11 is usually formed as a single unit into which reflective mirror 11M, the pair of first beams 11BL1, 11BR1, and the pair of second beams 11BL2, 11BR2 are all integrated, and beam 11 is formed of a single member. The embodiment, however, is not limited to this. Specifically, "first beam 11BL1 adjacent to reflective mirror 11M in one direction from reflective mirror 11M as seen in plan view" described herein may be reflective mirror 11M and its adjacent first beam 11BL1 that are formed either as a single unit or as separate beams 11 connected to each other. The same is applied to "first beam 11BR1 adjacent to reflective mirror 11M in the other direction from reflective mirror 11M as seen in plan view."

Figure 4:
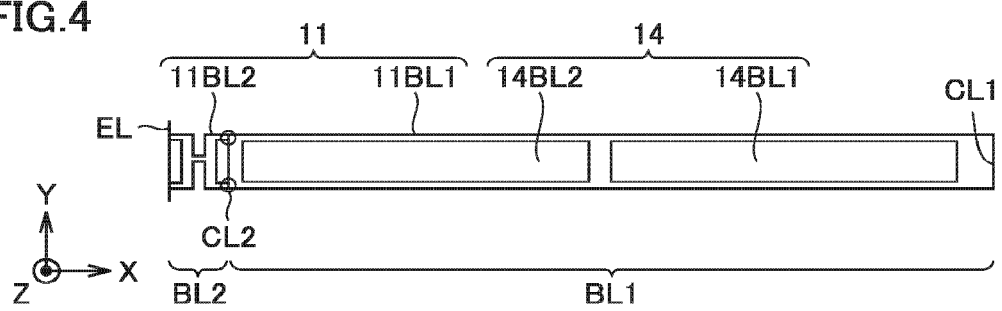
FIG. 4 is a schematic enlarged plan view of region IV defined by a dotted line in FIG. 2, particularly a schematic enlarged plan view showing a first example of the shape of an upper electrode as seen in plan view and a first example of the shape of a second beam as seen in plan view.
Figure 5:
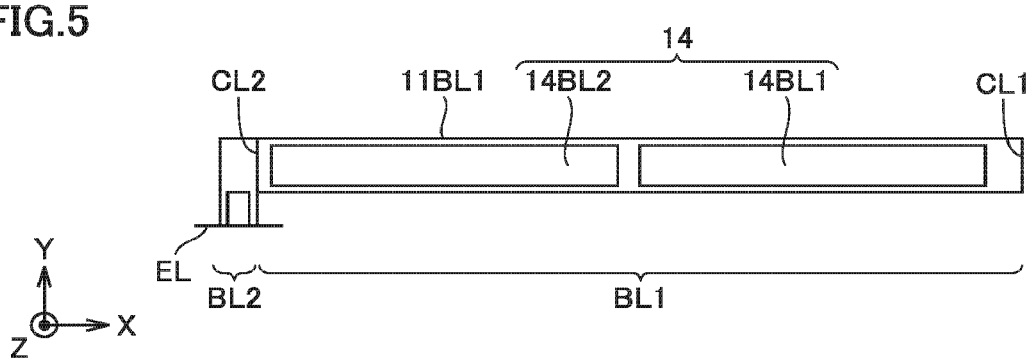
FIG. 5 is a schematic enlarged plan view showing a second example of the shape of the second beam as seen in plan view, which is different from FIG. 4.
Figure 6:
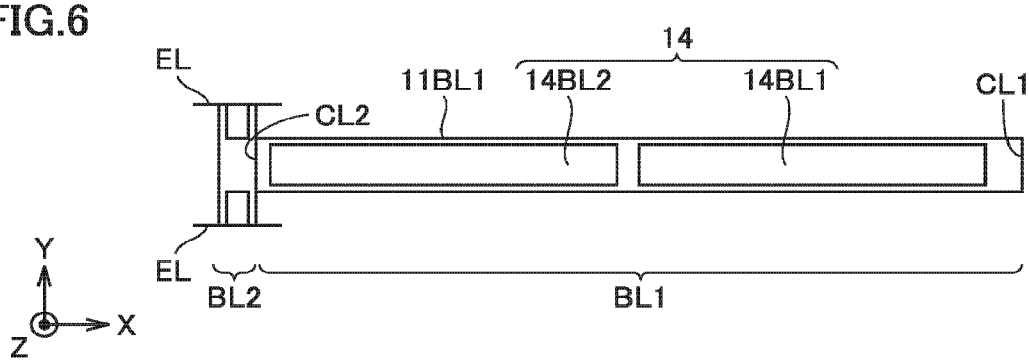
FIG. 6 is a schematic enlarged plan view showing a third example of the shape of the second beam as seen in plan view, which is different from FIG. 4.

Second beam portion BL2 is formed of second beam 11BL2 as a part of beam 11. Second beam portion BR2 is formed of second beam 11BR2 as a part of beam 11. Referring to FIG. 4, preferably second beam 11BL2 has an H shape as seen in plan view, in which a central portion of second beam 11BL2 in the X direction, which is a part of second beam 11BL2, is narrower than the remaining portion to have a smaller width in the Y direction, for example. The shape of second beam 11BL2, however, is not limited to this. For example, referring to FIG. 5, second beam 11BL2 may be shaped to have two cantilevers extending in the negative Y direction as seen in plan view. Specifically, a pair of cantilevers on one side and the other side in the X direction of second beam 11BL2 extends to protrude in the negative Y direction from the remaining portion of second beam 11BL2. Alternatively, referring to FIG. 6, second beam 11BL2 may be shaped to have two cantilevers in the positive Y direction and two cantilevers in the negative Y direction so that a portion of second beam 11BL2 continuing in the X direction from first beam 11BL1 is located between the cantilevers in the positive Y direction and the cantilevers in the negative Y direction as seen in plan view. The shapes shown in FIGS. 4 to 6 are applied not only to second beam 11BR1 but also to second beam 11BR2.

Figure 7:
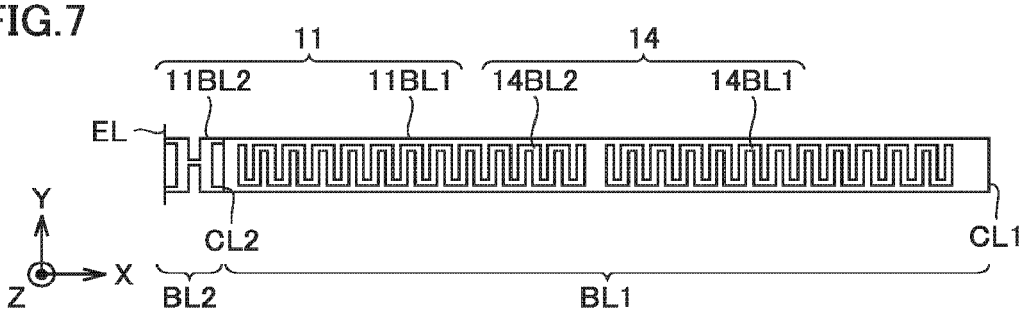
FIG. 7 is a schematic enlarged plan view showing a second example of the shape of the upper electrode as seen in plan view, which is different from FIG. 4.

Upper electrodes 14BL1, 14BL2 in FIG. 4 each have a rectangular shape extending in the X direction as seen in plan view. The shape as seen in plan view of upper electrodes 14BL1, 14BL2, however, is not limited to this. For example, referring to FIG. 7, each of upper electrodes 14BL1, 14BL2 may be shaped so that it extends generally in the X direction in which beam 11 extends, and is bent to extend back and forth multiple times along the Y direction, as seen in plan view. In this way, stress in the longitudinal direction of beam 11, namely X direction, generated in lower electrode 12 and upper electrode 14 when beam 11 is deformed, can be alleviated, and thus breakage due to fatigue of the metal material can be prevented. This contributes to reliable operation of mirror driving apparatus 100. This is applied not only to upper electrodes 14BL1, 14BL2 but also to upper electrodes 14BR1, 14BR2.

Left end EL and right end ER are disposed respectively at the left end and the right end of the entire mirror driving apparatus 100 in the X direction. Left end EL and right end ER act as fixing portions on the opposite ends in the X direction for fixing the whole mirror driving apparatus 100 made up of parts including beam 11. Left end EL is adjacent to second beam portion BL2 (second beam 11BL2) and opposite to reflective mirror 11M in the X direction, and right end ER is adjacent to second beam portion BR2 (second beam 11BR2) and opposite to reflective mirror 11M in the X direction. Although not shown specifically in FIGS. 2 to 4, each of left end EL and right end ER may be formed to include a part of the region of beam 11 (i.e., formed as a part of a single unit including first and second beams 11BL1, 11BL2 for example), or formed as a separate member from beam 11 for example.

In mirror driving apparatus 100, each of the pair of first beams 11BL1, 11BR1 is displaceable crosswise to the main surface which extends along the XY plane and on which lower electrode 12, piezoelectric film 13, and upper electrode 14 are stacked, namely displaceable in the Z direction. In other words, each of first beams 11BL1 and 11BR1 is deformable in the XZ plane. Moreover, one of first beams 11BL1 and 11BR1 can be displaced upward along the Z direction while the other can be displaced downward along the Z direction. In other words, first beams 11BL1 and 11BR1 can be displaced in respective directions different from each other along the Z direction crossing the main surface which extends along the XY plane and on which upper electrode 14 is disposed. Specifically, first beams 11BL1 and 11BR1 can be displaced in opposite directions along the Z direction crossing the main surface. For example, first beam 11BL1 can be displaced upward along the Z direction while first beam 11BR1 can be displaced downward along the Z direction.

In contrast, each of the pair of second beams 11BL2, 11BR2 is displaceable in the direction connecting the pair of first beams 11BL1, 11BR1 and the pair of second beams 11BL2, 11BR2, along the main surface of second beams 11BL2, 11BR2, i.e., displaceable in the X direction. In other words, second beams 11BL2, 11BR2 are not intended to be displaceable in the Z direction (except for slight shift due to error).

At first boundary portions CL1, CR1, reflective mirror 11M is directly adjacent to first beams 11BL1, 11BR1 respectively as seen in plan view. "Adjacent" herein means that reflective mirror 11M and first beams 11BL1, 11BR1 may be formed as a single beam 11, or may be separate parts of beam 11 that are connected together, as mentioned above. "Directly adjacent" herein means that reflective mirror 11M and first beam 11BL1/11BR1 are arranged continuously with no part interposed therebetween, so that they are located directly side by side.

First boundary portions CL1, CR1 are displaceable in the direction crossing the main surface on which elements such as piezoelectric films 13BL1, 13BL2 of first beams 11BL1, 11BR1 are formed, i.e., displaceable in the Z direction. In other words, first boundary portions CL1, CR1 are displaceable following displacement of the pair of first beams 11BL1, 11BR1.

Second boundary portion portions CL2, CR2 which forms form the boundary between first beam 11BL1/11BR1 and second beam 11BL2/11BR2 adjacent to first beam 11BL1/11BR1, are displaceable in the direction connecting first beams 11BL1, 11BR1 and second beams 11BL2, 11BR2, along the main surface of second beams 11BL2, 11BR2, i.e., displaceable in the X direction. In other words, second boundary portion CL2, CR2 are not intended to be displaceable in the Z direction (except for slight shift due to error).

A description is now given of respective materials for the members of mirror driving apparatus 100 and how they are connected electrically.

Beam 11 is made of single-crystal silicon without electrical conductivity, for example. Beam 11 may be any elastic material that may be flexed as a result of stretch/contraction of piezoelectric film 13 caused by application of an electric field. Lower electrode 12 is formed of a platinum thin film, for example. Platinum is suitable as a material for a base on which the material for piezoelectric film 13 is deposited. Piezoelectric film 13 is made of lead zirconate titanate (PZT) as a piezoelectric material. Upper electrode 14 and reflective film 14M are formed of a gold thin film. Gold exhibits high reflectivity for light. Gold is therefore suitable as a material for reflective film 14M for further increasing the reflectivity of reflective mirror 11M for light. The materials for lower electrode 12 and upper electrode 14 are not limited to the above-described ones, and may be any material allowing voltage to be applied to piezoelectric film 13.

Lower electrode 12BL1 is electrically insulated from upper electrodes 14BL1, 14BL2 by piezoelectric films 13BL1, 13BL2 located therebetween in the direction in which they are stacked. Lower electrode 12BR1 is also electrically insulated from upper electrodes 14BR1, 14BR2 by piezoelectric films 13BR1, 13BR2 located therebetween in the direction in which they are stacked. While electrical interconnection from each electrode is not shown in FIGS. 2 to 4, each electrode can be electrically connected to a power source external to mirror driving apparatus 100.

Although not shown specifically in FIGS. 2 to 4, lower electrode 12BL1 is electrically connected to lower electrode 12BR1 by an external power source connected by leads, and the potential of these lower electrodes 12BL1, 12BR1 is a reference potential.

Lower electrode 12BL1 and lower electrode 12BR1 may be electrically insulated from each other, or may be electrically connected to each other.

A description is now given of a method for manufacturing above-described mirror driving apparatus 100 with reference to FIGS. 8 to 14.

Figure 8:
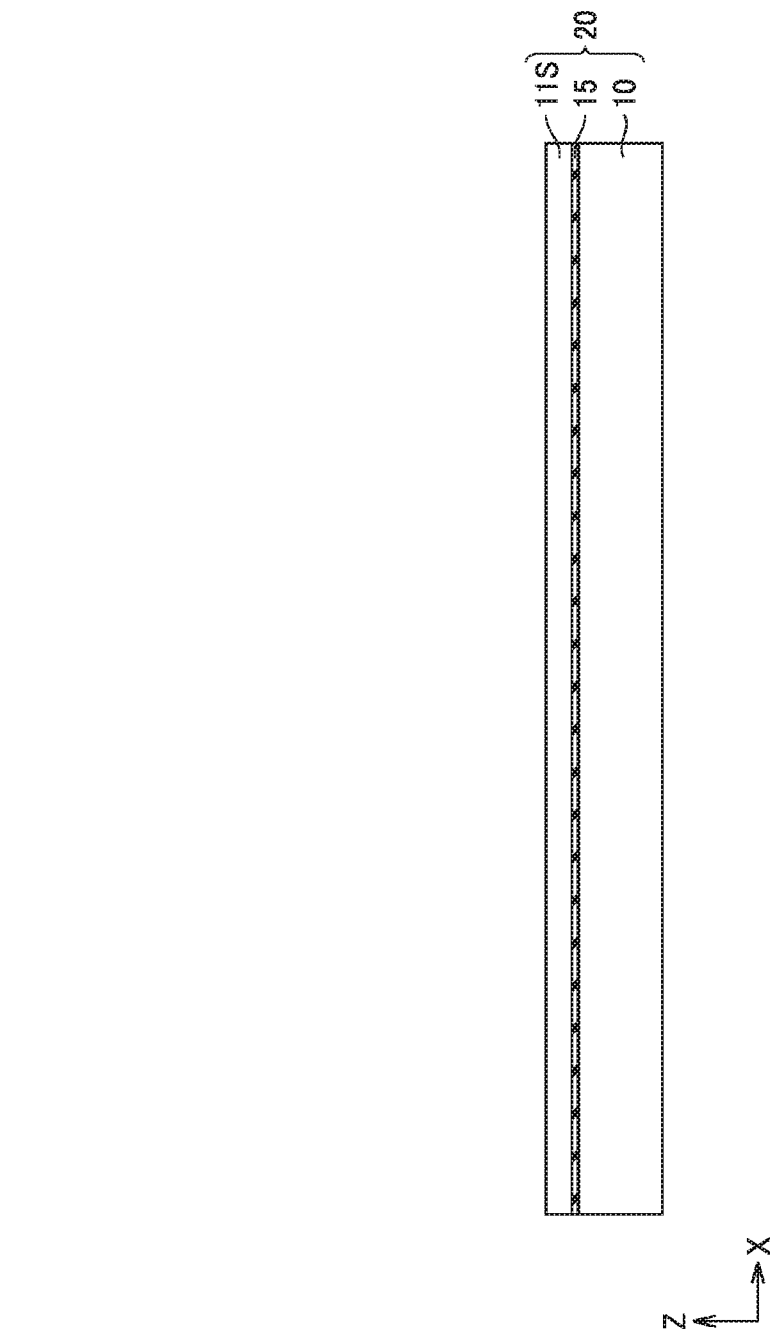
FIG. 8 is a schematic cross-sectional view showing a first step of a method for manufacturing the mirror driving apparatus in Embodiment 1.

Referring to FIG. 8, an SOI (Silicon on Insulator) substrate 20 is prepared in which a silicon layer 10 made of single-crystal silicon, a silicon oxide film layer 15 formed of a silicon oxide film, and a silicon layer 11S made of single-crystal silicon, for example, are stacked in this order.

Figure 9:
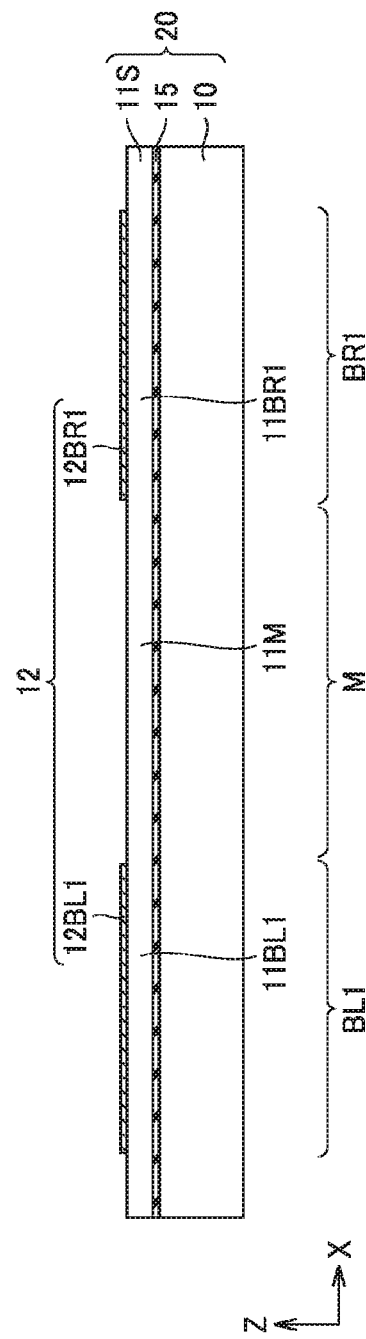
FIG. 9 is a schematic cross-sectional view showing a second step of the method for manufacturing the mirror driving apparatus in Embodiment 1.

Referring to FIG. 9, lower electrode 12, specifically a thin-film pattern of lower electrodes 12BL1, 12BR1, is formed by the common photolithography technique (deposition and patterning) and etching on the main surface of silicon layer 11S which is the uppermost layer, in the Z direction, of SOI substrate 20. The main surface of silicon layer 11S is a surface opposite to the surface thereof facing silicon oxide film layer 15, i.e., the main surface is a surface facing upward. Lower electrodes 12BL1, 12BR1 are formed in a region which is to form first beam portion BL1 and a region which is to form first beam portion BR1. Accordingly, first beam portions BL1, BR1 are formed. A central portion, in the X direction, of silicon layer 11S of first beam portions BL1, BR2 are formed as reflective mirror 11M and defined as a region to form reflective mirror portion M. In other words, the process shown in FIGS. 8 and 9 forms reflective mirror 11M capable of reflecting incident light, and first beams 11BL1, 11BR1 adjacent to reflective mirror 11M in one direction from reflective mirror 11M and the other direction therefrom, respectively.

Figure 10:
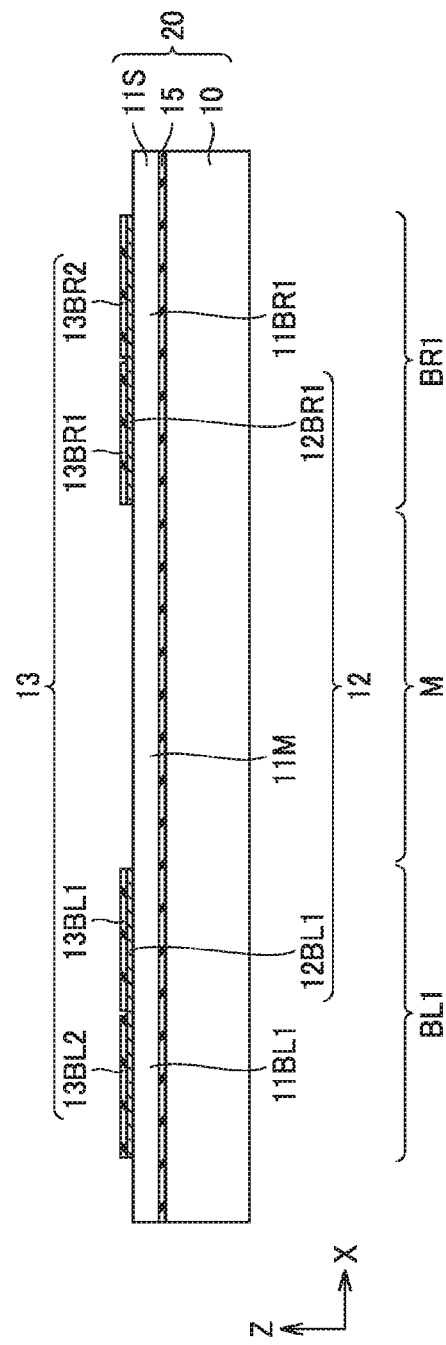
FIG. 10 is a schematic cross-sectional view showing a third step of the method for manufacturing the mirror driving apparatus in Embodiment 1.

Referring to FIG. 10, on the main surface, which faces upward along the Z direction, of lower electrodes 12BL1, 12BR1, piezoelectric film 13, specifically a thin-film pattern of piezoelectric films 13BL1, 13BL2, 13BR1, 13BR2 is formed by the common photolithography technique and etching.

Figure 11:
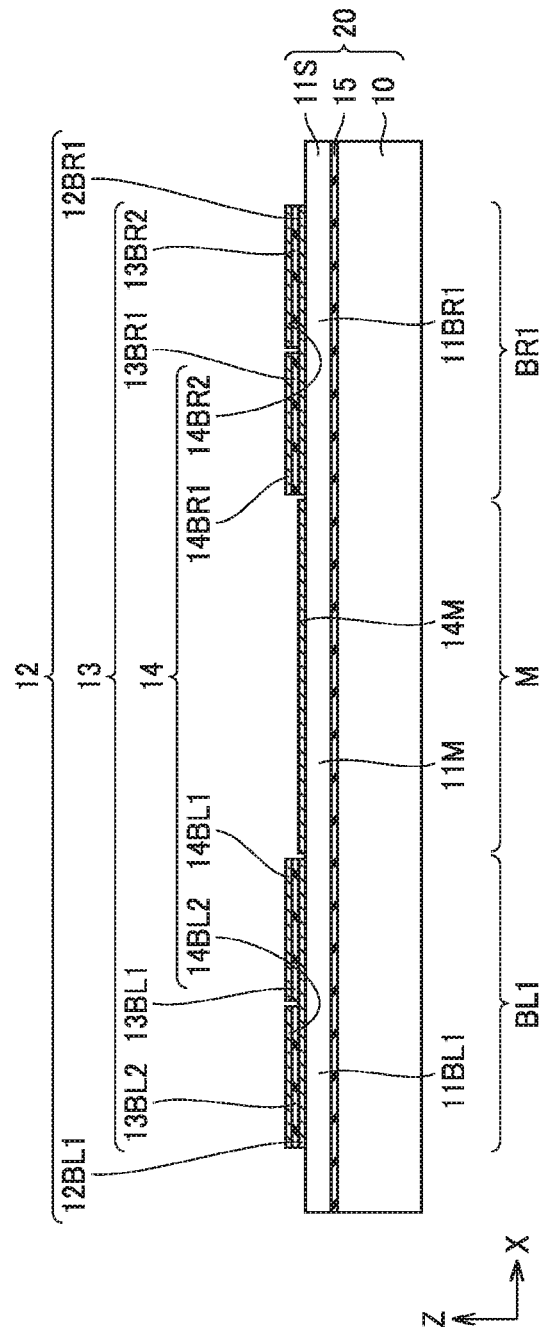
FIG. 11 is a schematic cross-sectional view showing a fourth step of the method for manufacturing the mirror driving apparatus in Embodiment 1.

Referring to FIG. 11, a thin-film pattern of upper electrodes 14BL1, 14BL2, 14BR1, 14BR2 of upper electrode 14 is formed to completely match and overlap the pattern of piezoelectric films 13BL1, 13BL2, 13BR1, 13BR2, respectively, as seen in plan view. Accordingly, on each of respective main surfaces of the pair of first beams 11BL1, 11BR1, a plurality of (two, for example) electrodes 14BL1, 14BL2/14BR1, 14BR2 are formed to be spaced from each other with piezoelectric film 13 interposed.

At the same time, particularly in a region to form reflective mirror portion M, a thin-film pattern for reflective film 14M which is the same layer as upper electrode 14BL1 for example is formed on silicon layer 11S. Accordingly, a part of beam 11 directly below the region where reflective film 14M is formed is a part where reflective mirror 11M is formed. Reflective mirror portion M is thus formed.

Figure 12:
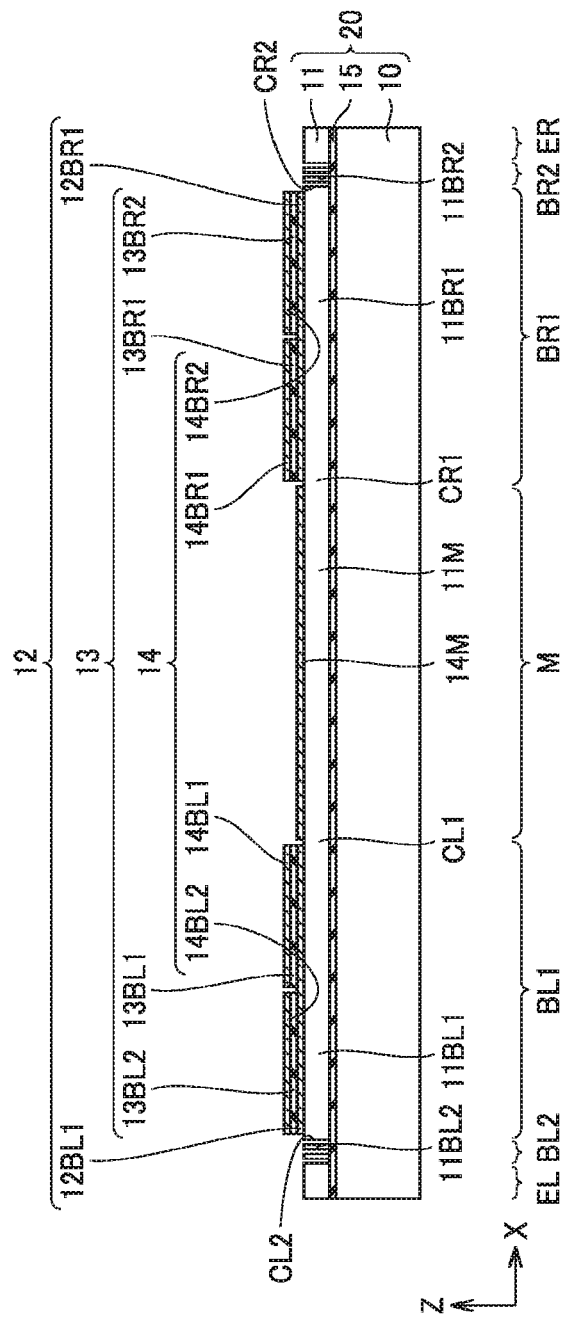
FIG. 12 is a schematic cross-sectional view showing a fifth step of the method for manufacturing the mirror driving apparatus in Embodiment 1.

Referring to FIG. 12, SOI substrate 20, particularly silicon layer 11S is partially patterned and etched to form the shape of second beams 11BL2, 11BR2 of second beam portions BL2, BR2 as shown in FIG. 4, for example. Preferably, the partial etching of silicon layer 11S is accomplished by inductive coupling type reactive ion etching called ICP-RIE (Inductive Coupled Plasma Reactive Ion Etching), for example. Second beam portions BL2, BR2 are formed as regions where the shape of second beams 11BL2, 11BR2 are formed. Second beam 11BL2/11BR2 is adjacent to first beam 11BL1/11BR1 and located opposite to reflective mirror 11M as seen in plan view. Beam 11 also includes first boundary portions CL1, CR1 and second boundary portions CL2, CR2 as boundaries between corresponding regions.

Figure 13:
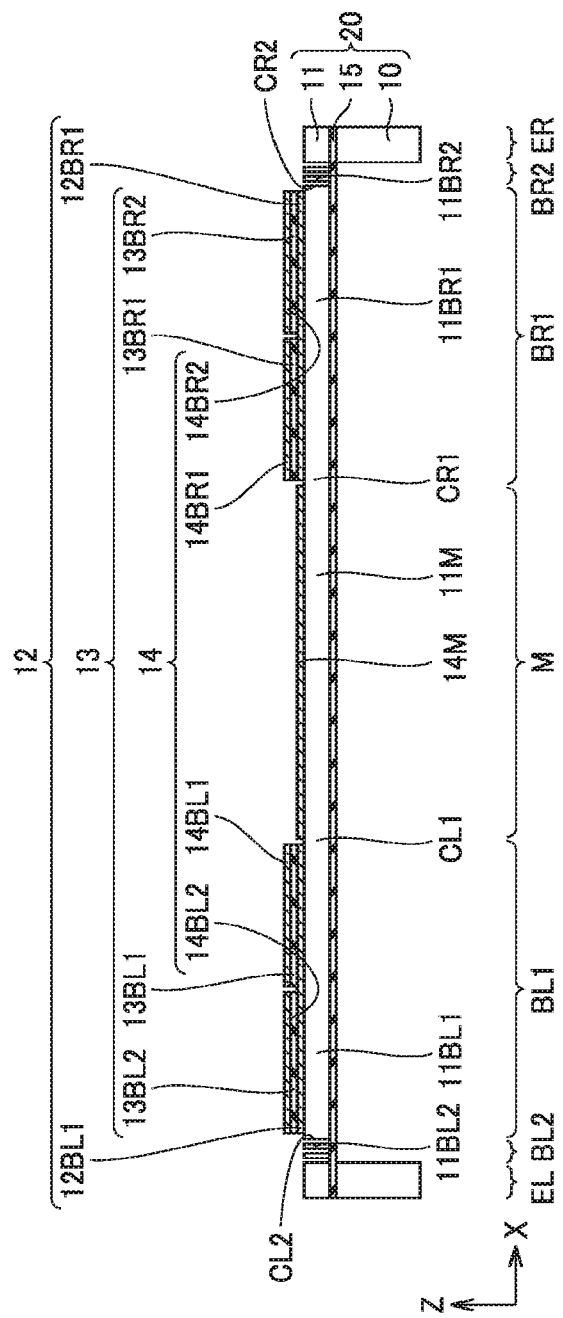
FIG. 13 is a schematic cross-sectional view showing a sixth step of the method for manufacturing the mirror driving apparatus in Embodiment 1.
Figure 14:
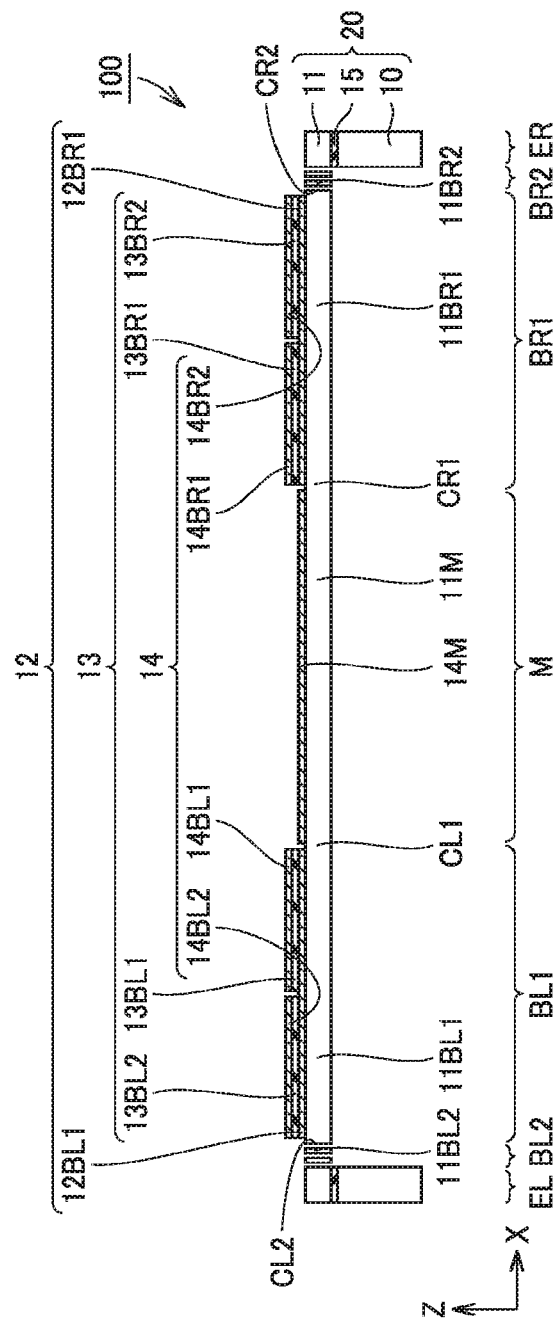
FIG. 14 is a schematic cross-sectional view showing a seventh step of the method for manufacturing the mirror driving apparatus in Embodiment 1.

As described above in connection with the process steps, respective ranges of regions to form first beam portions BL1, BR1, the region to form reflective mirror portion M, and the regions to form second beam portions BL2, BR2 are clearly defined. Accordingly, reflective mirror portion M, first beam portions BL1, BR1, and second beam portions BL2, BR2 are formed. In other words, a pair of beam portions adjacent to reflective mirror 11M is formed so that reflective mirror 11M is located between these beam portions in the X direction as seen in plan view, i.e., first beam portion BL1 and first beam portion BR1 as well as second beam portion BL2 and second beam portion BR2 are formed. The pair of beam portions includes first beams 11BL1, 11BR1 located directly adjacent to reflective mirror 11M so that reflective mirror 11M is sandwiched therebetween, and second beams 11BL2, 11BR2 located opposite to reflective mirror 11M with respect to first beams 11BL1, 11BR1. Silicon layer 11S as an uppermost layer of the SOI substrate is formed as beam 11. On the outside in the X direction, i.e., on respective ends in the X direction, of second beam portions BL2, BR2, left end EL and right end RE may be formed. In FIGS. 12 to 14, left end EL and right end ER are formed.

Referring to FIG. 13, silicon layer 10 of reflective mirror portion M, first beam portions BL1, BR1, and second beam portions BL2, BR2 is removed by ICP-RIE, for example. Accordingly, beam 11 is entirely supported by silicon layer 10 of left end EL and right end ER, for example.

Referring to FIG. 14, silicon oxide film layer 15 of reflective mirror portion M, first beam portions BL1, BR1, and second beam portions BL2, BR2 is removed by dry etching using tetrafluoromethane CF4, for example.

As shown in FIG. 2, the final shape of reflective mirror portion M including reflective mirror 11M is a circular shape for example as seen in plan view, while the final shape of other portions such as first and second beam portions BL1, BL2 is an elongate shape as seen in plan view. Therefore, in the steps of FIGS. 12, 13, and 14 for example, unnecessary regions of SOI substrate 20 are removed to form the shape as seen in plan view as shown in FIG. 2. In this way, mirror driving apparatus 100 shown in FIGS. 2 to 4 is formed.

As seen from the above, mirror driving apparatus 100 in the present embodiment can be formed by applying the so-called semiconductor microfabrication technology or MEMS device technology in which deposition, patterning, and etching for example are repeatedly performed on a silicon substrate, for example. Using the above-described manufacturing method, all of reflective mirror 11M of reflective mirror portion M, first beams 11BL1, 11BR1 of first beam portions BL1, BR1, and second beams 11BL2, 11BR2 of second beam portions BL2, BR2 of mirror driving apparatus 100 in the present embodiment are formed as a single beam 11.

Figure 15:
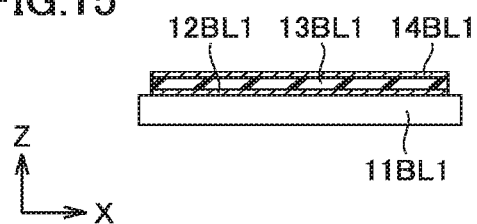
FIG. 15 is a schematic enlarged cross-sectional view of one piezoelectric element extracted from FIG. 2.
Figure 16:
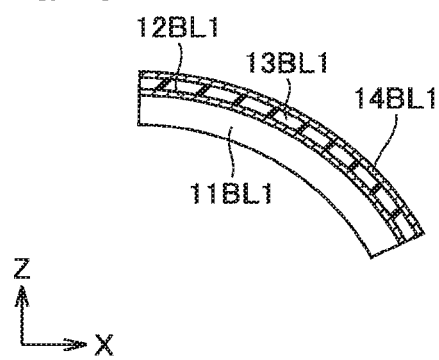
FIG. 16 is a schematic enlarged cross-sectional view illustrating deformation when a positive voltage is applied to an upper electrode of the piezoelectric element in FIG. 15.
Figure 17:
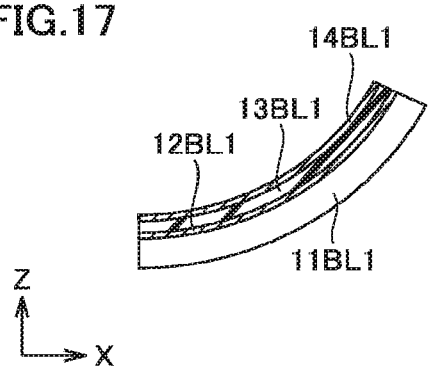
FIG. 17 is a schematic enlarged cross-sectional view illustrating deformation when a negative voltage is applied to the upper electrode of the piezoelectric element in FIG. 15.

In the following, a description is given of an operation of and a method for controlling mirror driving apparatus 100 in the present embodiment, and then a description is given of the function and effect of the present embodiment. Referring first to FIGS. 15 to 17, an operational principle of a piezoelectric element as an element of mirror driving apparatus 100 in the present embodiment is described.

Referring to FIG. 15, FIGS. 15 to 17 mentioned below show an extracted region of first beam portion BL1 in which about a right half, in the X direction, of first beam 11BL1 and lower electrode 12BL1, as well as piezoelectric film 13BL1 and upper electrode 14BL1 located directly above them are stacked, and an operational principle of deformation of this region for example is described.

In first beam portion BL1 of mirror driving apparatus 100, lower electrode 12BL1 and upper electrode 14BL1 are disposed opposite to each other with respect to the Z direction with piezoelectric film 13BL1 interposed therebetween to form a piezoelectric element. Likewise, a piezoelectric element in which lower electrode 12BL1 and upper electrode 14BL2 are opposite to each other with piezoelectric film 13BL2 interposed therebetween, a piezoelectric element in which lower electrode 12BR1 and upper electrode 14BR1 are opposite to each other with piezoelectric film 13BR1 interposed therebetween, and a piezoelectric element in which lower electrode 12BR1 and upper electrode 14BR2 are opposite to each other with piezoelectric film 13BR2 interposed therebetween, are formed.

For these piezoelectric elements each, a voltage can be applied between a pair of electrodes 12 and 14 sandwiching piezoelectric film 13 in the top-bottom direction to thereby apply an electric field to piezoelectric film 13. Therefore, a voltage applied between lower electrode 12BL1 and upper electrode 14BL1 in FIG. 15 causes an electric field to be applied, in the film thickness direction, namely Z direction, to piezoelectric film 13BL1 sandwiched between these electrodes. Accordingly, depending on the direction of the electric field, piezoelectric film 13BL1 stretches/contracts in the direction along the main surface, i.e., XY plane. Piezoelectric film 13BL1 thus deforms to warp a part of first beam 11BL1 over which piezoelectric film 13BL1 is deposited.

Referring to FIG. 16, when a positive voltage is applied to upper electrode 14BL1 and a negative voltage is applied to lower electrode 12BL1 for example, a downward electric field along the Z direction is applied to piezoelectric film 13BL1 between these electrodes. At this time, if piezoelectric film 13BL1 is deformed to stretch along the main surface along the XY plane, first beam 11BL1 located directly below the piezoelectric film is warped in a convex shape protruding upward along the Z direction. Consequently the stack of the piezoelectric element is entirely warped in a convex shape protruding upward along the Z direction.

Referring to FIG. 17, when a negative voltage is applied to upper electrode 14BL1 and a positive voltage is applied to lower electrode 12BL1 for example, an upward electric field along the Z direction is applied to piezoelectric film 13BL1 between these electrodes. At this time, if piezoelectric film 13BL1 is deformed to contract along the main surface along the XY plane, first beam 11BL1 located directly below the piezoelectric film is warped in a convex shape protruding downward along the Z direction. Consequently the stack of the piezoelectric element is entirely warped in a convex shape protruding downward along the Z direction. As seen from the above, depending on the direction of the electric field applied to piezoelectric film 13 of the piezoelectric element, one of stretch and contraction occurs. It is therefore possible to change the direction of the warp of piezoelectric film 13 by changing the polarity of the voltage (positive or negative) applied to upper electrode 14, and to change the curvature of the warp of piezoelectric film 13 by changing the magnitude of the voltage applied to upper electrode 14. In other words, depending on the polarity (positive/negative) and the magnitude of the voltage between upper electrode 14 and lower electrode 12, warp of beam 11 directly below them can be controlled.

Such a nature of deformation of the piezoelectric element is used to control the inclination angle and the displacement for example of reflective mirror portion M including reflective mirror 11M of mirror driving apparatus 100. Referring next to FIGS. 18 to 21, a method for controlling mirror driving apparatus 100 using the piezoelectric elements is described.

Figure 18:
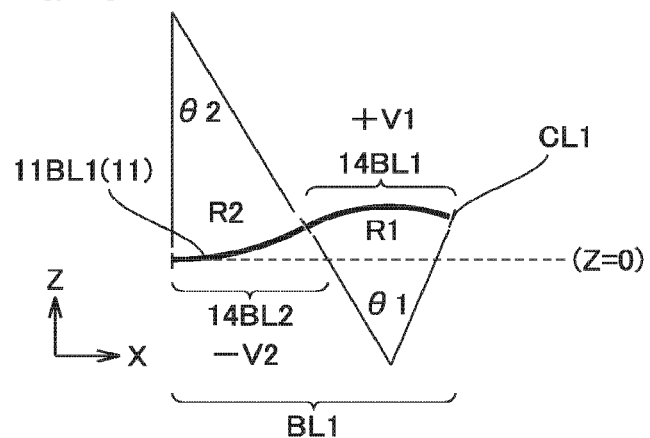
FIG. 18 is a schematic enlarged view illustrating deformation of a beam of the whole of one of the first beam portions extracted from FIG. 2, caused by voltage application to a piezoelectric clement.
Figure 19:
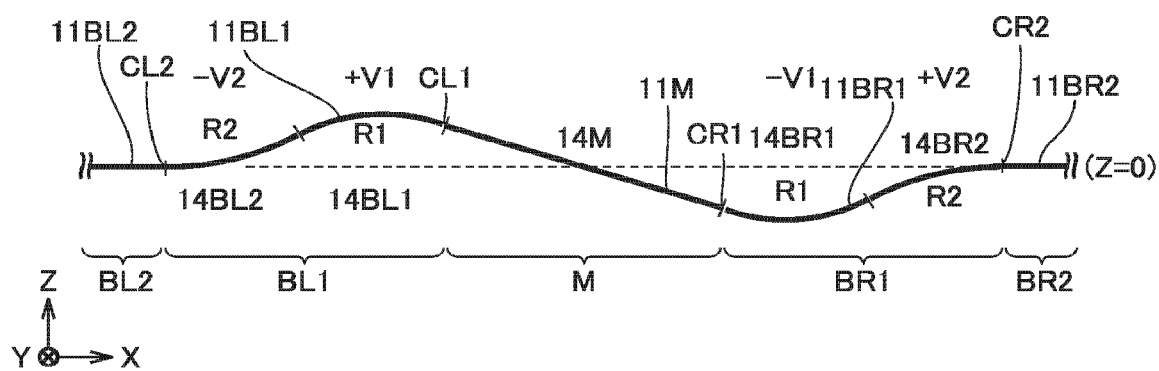
FIG. 19 is a schematic enlarged view illustrating deformation of a beam of a mirror portion and two first beam portions as a whole extracted from FIG. 2, caused by voltage application to piezoelectric elements.
Figure 20:
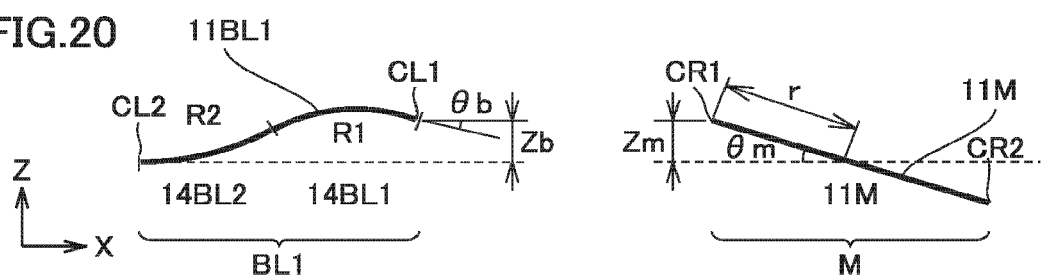
FIG. 20 is a schematic enlarged view showing dimensions of the mirror portion and components of a first beam portion in FIG. 19 as well as inclination angles with respect to the X direction.

Regarding FIGS. 18 to 20, beam 11 in each region such as first beam portion BL1 is considered, and it is supposed that basically beam 11 is deformed following deformation of piezoelectric film 13 deposited directly above beam 11. Referring to FIG. 18, both the region in which upper electrode 14BL1 is located and its adjacent region in which upper electrode 14BL2 is located in first beam portion BL1, are considered.

When mirror driving apparatus 100 is actually driven, a voltage of a certain polarity is applied to upper electrode 14BL1 as a first electrode located relatively closer to reflective mirror 11M, out of a plurality of (two) upper electrodes 14BL1, 14BL2 arranged in first beam portion BL1, and a voltage of the opposite polarity is applied to upper electrode 14BL2 as a second electrode located adjacent to upper electrode 14BL1. Specifically, the potential of lower electrode 12BL1 (see FIG. 15) is used as a reference potential, a positive voltage +V1 is applied to upper electrode 14BL1, and a negative voltage −V2 opposite in polarity to upper electrode 14BL1 is applied to upper electrode 14BL2, where |V1|>|V2|.

As shown schematically in FIG. 18, in a part of the piezoelectric element including upper electrode 14BL1, first beam 11BL1 is deformed to protrude upward along the Z direction, while in a part of the piezoelectric element including upper electrode 14BL2, first beam 11BL1 is deformed to protrude downward along the Z direction. The part of the piezoelectric element including upper electrode 14BL1 has radius of curvature R1, the part of the piezoelectric element including upper electrode 14BL2 has radius of curvature R2, and R2>R1 holds. The warp of the part of first beam 11BL1 directly below upper electrode 14BL1 is therefore larger than the warp of the part of first beam 11BL1 directly below upper electrode 14BL2.

The length in the X direction of upper electrode 14BL1 is substantially identical to that of upper electrode 14BL2. There is thus an inversely proportional relation between radius of curvature R1, R2 and central angle θ1, θ2 of the arc formed in the X direction due to the warp of beam 11.

Because radius of curvature R1 is smaller than radius of curvature R2, the right end in the X direction of beam 11 corresponding to upper electrode 14BL1 is inclined downward along the Z direction at the coordinate position (Z>0) higher than a reference position (Z=0) in the Z direction in FIG. 18. First boundary portion CL1 located at the right end in the X direction of the beam corresponding to upper electrode 14BL1 is adjacent to reflective mirror 11M of reflective mirror portion M, and therefore, the right side in the X direction of reflective mirror 11M is rotationally displaced to be inclined downward along the Z direction, following the aforementioned inclination of beam 11 at first boundary portion CL1. Thus, deformation of piezoelectric film 13 caused by a voltage applied to the piezoelectric element in mirror driving apparatus 100 is used to incline reflective mirror 11M.

FIG. 18 considers only first beam 11BL1 of first beam portion BL1. Referring next to FIG. 19, a description is given of application of a voltage to the piezoelectric element and deformation inclination of each region in the case where not only first beam 11BL1 but also reflective mirror portion M, first beam portion BR1 and second beam portions BL2, BR2 of mirror driving apparatus 100 are considered.

Referring to FIG. 19, respective voltages of the same absolute values and opposite polarities are applied to upper electrode 14BL1, which is a first electrode for first beam 11BL1 of the pair of first beams 11BL1, 11BR1, and upper electrode 14BR1, which is a first electrode for the opposite first beam 11BR1. Respective voltages of the same absolute values and opposite polarities are also applied to upper electrode 14BL2, which is a second electrode for first beam 11BL1 of the pair of first beams 11BL1, 11BR1, and upper electrode 14BR2, which is a second electrode for the opposite first beam 11BR1. Specifically, positive voltage +V1 is applied to upper electrode 14BL1 while negative voltage −V1 of the same absolute value and the opposite polarity is applied to upper electrode 14BR1, similarly to FIG. 18. Negative voltage −V2 is applied to upper electrode 14BL2 while positive voltage +V2 of the same absolute value and the opposite polarity is applied to upper electrode 14BR2, similarly to FIG. 18.

At this time, as shown schematically in FIG. 19, first beam 11BR1 corresponding to the part of the piezoelectric element including upper electrode 14BR1 deforms in a convex shape protruding downward along the Z direction, while first beam 11BR1 corresponding to the part of the piezoelectric element including upper electrode 14BR2 deforms in a convex shape protruding upward along the Z direction. The part of the piezoelectric element including upper electrode 14BR2 has radius of curvature R1, the part of the piezoelectric element including upper electrode 14BL2 has radius of curvature R2, and R2>R1 holds, like first beam 11BL1. Therefore, the left end in the X direction of beam 11 corresponding to upper electrode 14BR1 is inclined upward along the Z direction at the coordinate position (Z<0) lower than the reference position (Z=0) in the Z direction in FIG. 19. First boundary portion CR1 located at the left end in the X direction of the beam corresponding to upper electrode 14BR1 is adjacent to reflective mirror 11M of reflective mirror portion M, and therefore, the left side in the X direction of reflective mirror 11M is rotationally displaced to be inclined upward along the Z direction, following the aforementioned inclination of beam 11 at first boundary portion CR1.

At second boundary portion CL2 between first beam 11BL1 and second beam 11BL2 and second boundary portion CR2 between first beam 11BR1 and second beam 11BR2, beam 11 is located at the reference coordinate position (Z=0), and second beams 11BL2, 11BR2 are entirely maintained at the Z=0 position.

Thus, the deformation of beam 11 in FIG. 19 as a whole has point symmetry with respect to Y coordinate 0 of the Y axis at the center of reflective mirror 11M in the X direction. Beam 11 in FIG. 19 corresponding to reflective mirror portion M, first beam portions BL1, BR1, and first boundary portions CL1, CR1 is displaceable in the Z direction, while beam 11 corresponding to second boundary portions CL2, CR2 and second beam portions BL2, BR2 is located at the Z=0 position and is not displaced in the Z direction.

In the case where beam 11 of reflective mirror portion M and first beam portions BL1, BR1 is formed as a single unit as shown in FIGS. 8 to 14, for example, the process for forming beam 11 can be further simplified. In this case, however, beam 11 is more likely to be affected by stress from other members constituting mirror driving apparatus 100, as compared with the case where the portions of beam 11 between the aforementioned regions are formed as separate members. If beam 11 is configured to have first boundary portions CL1, CR1 between reflective mirror 11M and first beams 11BL1, 11BR1 that are not displaced in the Z direction but only displaceable in the XY direction, the flatness of reflective mirror 11M could be deteriorated. This is for the following reason. In the case where first beams 11BL1, 11BR1 and first boundary portions CL1, CR1 cannot be shifted in the Z direction by deformation of beam 11 when the piezoelectric element is driven, beam 11 is subjected to moment about the Y axis to cause deformation of reflective mirror 11M.

In view of the above, mirror driving apparatus 100 of the present embodiment is configured to have a pair of first beams 11BL1, 11BR1 that are displaceable in the Z direction crossing the main surface of beam 11. Likewise, first boundary portions CL1, CR1 are displaceable in the Z direction crossing the main surface of beam 11. Accordingly, the possibility that beam 11 is subjected to moment about the Y axis as mentioned above to cause deformation of reflective mirror 11M can be reduced.

First beam 11BL1 is displaced upward along the Z direction in FIG. 19 while first beam 11BR1 is displaced downward along the Z direction in FIG. 19. Thus, first beams 11BL1 and 11BR1 are displaceable in respective directions different from each other (opposite directions) with respect to the Z direction. It is therefore possible to cause both first beams 11BL1 and 11BR1 to be inclined downward to the right respectively at first boundary portion CL1 and first boundary portion CR1 for example as shown in FIG. 19. Reflective mirror 11M sandwiched between these first boundary portions CL1 and CR1 can thus be kept linear, namely flat in FIG. 19, and deterioration of the flatness of reflective mirror 11M can be suppressed.

If the whole of beam 11 including second beams 11BL2, 11BR2 for example is displaceable in the Z direction, there is disadvantageously no region for cancelling displacement in the X direction resulting from displacement in the Z direction of beam 11 of first beam 11BL1 for example. In view of this, each of the pair of second beams 11BL2, 11BR2 of mirror driving apparatus 100 in the present embodiment is displaceable in the direction connecting the pair of first beams 11BL1, 11BR1 and the pair of second beams 11BL2, 11BR2, along the main surface of second beams 11BL2, 11BR2, namely displaceable in the X direction. Second boundary portions CL2, CR2 are also displaceable in the X direction. These regions are hardly displaced in the Z direction. Therefore, a change in length in the X direction resultant from displacement of first beams 11BL1, 11BR1 in the Z direction can be absorbed to be cancelled.

Second beam 11BL2/11BR2 displaceable in the X direction and non-displaceable in the Z direction is located adjacent to first beam 11BL1/11BR1 and opposite to reflective mirror 11M. In other words, second beam 11BL2/11BR2 is located at a longer distance from reflective mirror 11M relative to the distance between first beam 11BL1/11BR1 and reflective mirror 11M. The portion displaceable in the X direction (only) is thus located away from reflective mirror 11M. Therefore, even when second beams 11BL2, 11BR2 and second boundary portions CL2, CR2 are displaced in the X direction only, the possibility that beam 11 is affected by this displacement and subjected to moment about the Y axis resulting in deformation of reflective mirror 11M can be reduced.

First beams 11BL1, 11BR1 and first boundary portions CL1, CR1 are displaceable in the Z direction while second beams 11BL2, 11BR2 and second boundary portions CL2, CR2 are displaceable in the X direction (only) in the manner show in FIG. 19 as described above. This is because the inflection direction is controlled by voltage application to the piezoelectric elements. Specifically, referring again to FIG. 19, respective voltages of the same absolute values and opposite polarities are applied to upper electrode 14BL1 of first beam portion BL1 located relatively closer to reflective mirror 11M and upper electrode 14BR1 of first beam portion BR1 located relatively closer to reflective mirror 11M. Accordingly, one of upper electrode 14BL1 and upper electrode 14BR1 can be deformed in a convex shape protruding upward along the Z direction while the other thereof can be deformed in a convex shape protruding downward along the Z direction, and respective radii of curvature of these electrodes can be made substantially identical to each other. Thus, one of the pair of first boundary portions CL1, CR1 can be deformed at a position higher than Z=0 and the other can be deformed at a position lower than Z=0, so that the displacement has point symmetry with respect to Y=0 and both are inclined downward to the right with respect to the X direction. In this way, reflective mirror 11M located between first boundary portions CL1 and CR1 can be inclined without causing deformation such as curve of the mirror.

Reflective mirror 11M can be inclined by voltage application to the piezoelectric elements to cause rotational displacement about the Y axis, even when no member supports beam 11 in the Y direction.

In first beam portion BL1, respective voltages of opposite polarities are applied to upper electrode 14BL1 located relatively closer to reflective mirror 11M and upper electrode 14BL2, and therefore, one of upper electrode 14BL1 and upper electrode 14BL2 can be deformed in a convex shape protruding upward along the Z direction and the other can be deformed in a convex shape protruding downward along the Z direction. Beam 11 can be inflexed so that the Z coordinate of second boundary portion CL2 is 0 even when the Z coordinate of first boundary portion CL1 is not 0 and beam 11 is inclined with respect to the Z direction. The point of inflection is located at the boundary between upper electrode 14BL1 and upper electrode 14BL2 where the direction of curve is inverted with respect to the Z direction. In this way, second boundary portion CL2 and second beam 11BL2 located further away from reflective mirror 11M can be displaced in the X direction (only) while being kept at the Z coordinate 0.

A description is further given of the method for controlling mirror driving apparatus 100, specifically a control method for more reliably suppressing deterioration of the flatness of reflective mirror 11M.

Voltage application to upper electrodes 14BL1, 14BL2, 14BR1, 14BR2 can be controlled as described above to thereby control the posture of reflective mirror 11M, specifically the inclination direction and the inclination angle of reflective mirror 11M. Consideration is now given to inclination of reflective mirror 11M and inclination of first boundary portion CL1 between first beam portion BL1 and reflective mirror 11M. While the following description is of first boundary portion CL1 between first beam portion BL1 and reflective mirror 11M, basically the same is applied as well to first boundary portion CR1 between first beam portion BR1 and reflective mirror 11M.

FIG. 20 shows first beam portion BL1 and reflective mirror portion M extracted from FIG. 19. Referring to FIG. 20, in order to make zero the stress generated particularly in first boundary portion CL1 of beam 11, the following Formula 1 and Formula 2 may be satisfied. Specifically, Z direction coordinate Zb of first boundary portion CL1 between first beam 11BL1 and reflective mirror 11M, Z direction coordinate Zm of the first boundary portion CL1-side end of reflective mirror 11M, X direction radius r of reflective mirror 11M, inclination angle θm of reflective mirror 11M with respect to the X axis, and inclination angle θb of first boundary portion CL1 of first beam 11BL1 with respect to the X axis may satisfy $$Zb = Zm = r \tan \theta m \quad \text{Formula 1}$$

$$\theta b = \theta m = \theta 1 - \theta 2 \quad \text{Formula 2}$$

where θ1 in Formula 2 is the central angle of the arc formed by the region overlapping upper electrode 14BL1 as seen in plan view, as a result of voltage application to upper electrode 14BL1 of first beam portion BL1, and corresponds to angle θ1 in FIG. 18, and θ2 in Formula 2 is the central angle of the arc formed by the region overlapping upper electrode 14BL2 as seen in plan view, as a result of voltage application to upper electrode 14BL2 of first beam portion BL1, and corresponds to angle θ2 in FIG. 18.

θ1 and θ2 satisfying the above-specified relation can be determined to make zero the stress generated in first boundary portion CL1. There are, however, multiple solutions for θ1 and θ2 satisfying this relation. For the sake of practical application, it is supposed that the following two conditions 1) and 2) are met.

1) The X direction dimension of upper electrode 14BL1 is equal to the X direction dimension of upper electrode 14BL2.

2) Angle θ1 and angle θ2 have the relation defined by the following Formula 3, i.e., the ratio between angle θ1 and angle θ2 is kept at a certain value determined by mirror driving apparatus 100. Specifically, θ1 and θ2 satisfy the relation:

$$\theta 1 = \alpha \cdot \theta 2 \quad \text{Formula 3}$$

where α is a constant. An electric field is applied to piezoelectric films 13BL1, 13BL2 of the piezoelectric element so as to meet the relation defined by Formula 3.

Figure 21:
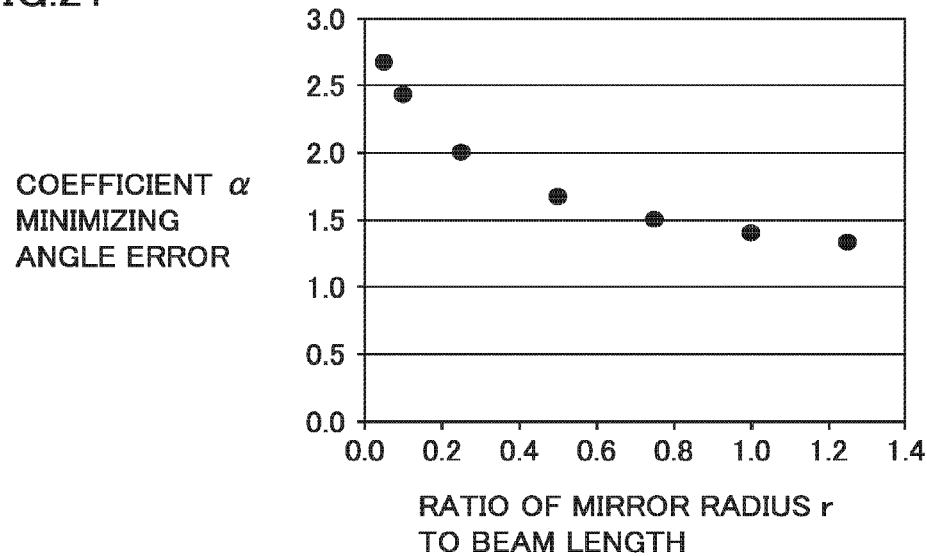
FIG. 21 is a graph showing a relation between a ratio of the radius of a reflective mirror to the beam length, and coefficient α that minimizes an angle error at a first boundary portion of the beam.

Referring to FIG. 21, the horizontal axis of the graph represents the ratio of the mirror radius, i.e., the value of the X direction radius r of reflective mirror 11M (see FIG. 20), to the beam length, particularly the X direction length of first beam 11BL1. The vertical axis of the graph represents the value of coefficient α that minimizes an angle error under a certain condition of the X direction dimension of first beam 11BL1 and that of reflective mirror 11M. More specifically, depending on the ratio of the X direction dimension of reflective mirror 11M to the X direction dimension of first beam 11BL1 in each mirror driving apparatus 100, the value of coefficient α is determined so that an error amount between Zb and Zm is minimized, i.e., the stress generated in first boundary portion CL1 is zero. This graph is referenced to determine the value of α.

Central angles θ1, θ2 of respective arcs generated by deformation of first beam portion BL1 depends on the voltages applied to upper electrodes 14BL1, 14BL2 (see FIG. 18). Therefore, depending on the ratio of the value of radius r of reflective mirror 11M to the X direction length of first beam 11BL1 represented by the horizontal axis in FIG. 21, the ratio between applied voltages |V1| and |V2| in FIG. 18 is set. Accordingly, the stress generated in first boundary portion CL1 and reflective mirror 11M can be reduced sufficiently and deterioration of the flatness of reflective mirror 11M can be suppressed. In other words, first beam 11BL1 and reflective mirror 11M which are adjacent to each other with first boundary portion CL1 in between can be inclined at the same angles to suppress generation of stress in first boundary portion CL1 as well as deterioration of the flatness of reflective mirror 11M.

Once the value of constant α depending on respective dimensions of the relevant members is determined, θb is set. Moreover, the X direction length of first beam 11BL1 is determined. Then, the value of θm is determined by Formula 2 and replaced into Formula 1. The value of Zb is determined accordingly. Once θm is determined, the value of Zb can also be determined by replacing θm and the value of r into Formula 1. For example, supposing that inclination angle θm falls in a range of ±10°. The ratio of an error of Zb with respect to Zm is then determined from radius r of reflective mirror 11M. The determined ratio is 0.2% or less. Specifically, if radius r of reflective mirror 11M is 500 μm, the error of the Z direction displacement is 0.1 μm or less. Accordingly, in terms of practical application, the error of the value of Zb with respect to Zm is sufficiently small. It is therefore possible to sufficiently reduce the stress generated in first boundary portion CL1 and reflective mirror 11M and suppress deterioration of the flatness of reflective mirror 11M.

In the example shown in FIGS. 18 to 20, reflective mirror 11M is inclined downward to the right. The above description, however, is applied as well to reflective mirror 11M inclined downward to the left.

Other functions and effects of the present embodiment are described one by one in the following. Regarding mirror driving apparatus 100 in the present embodiment, generation of stress in first boundary portions CL1, CR1 and reflective mirror 11M when the mirror is driven can be suppressed, and therefore, improvement of the stiffness of reflective mirror 11M for the purpose of suppressing deformation of reflective mirror 11M is unnecessary.

Mirror driving apparatus 100 having the above-described characteristics can be formed easily by applying the manufacturing method described above and shown in FIGS. 8 to 14. In particular, from silicon layer 11S of SOI substrate 20, beam 11 as a single unit including respective regions of reflective mirror portion M, first beam portion BL1, and second beam portion BL2 can be formed so that these regions are substantially identical to each other in terms of the Z direction thickness. It is therefore unnecessary that only reflective mirror 11M is formed thicker than other regions of beam 11, or it is unnecessary to join a separate member which is to form the mirror portion and has a greater thickness. Beam 11 can therefore be formed more easily.

In mirror driving apparatus 100, piezoelectric film 13 on first beam 11BL1 for example is divided into a plurality of (two) piezoelectric films, i.e., piezoelectric film 13BL1 and piezoelectric film 13BL2. Piezoelectric film 13 can thus be divided into a plurality of films to alleviate or prevent influence of the polarity of the voltage applied to one of the regions of the divided piezoelectric film of the piezoelectric element on the other region. It is therefore possible to deform each of the regions of the divided piezoelectric film of first beam 11BL1 with higher precision, and control the posture of reflective mirror 11M with higher precision.

Figure 22:
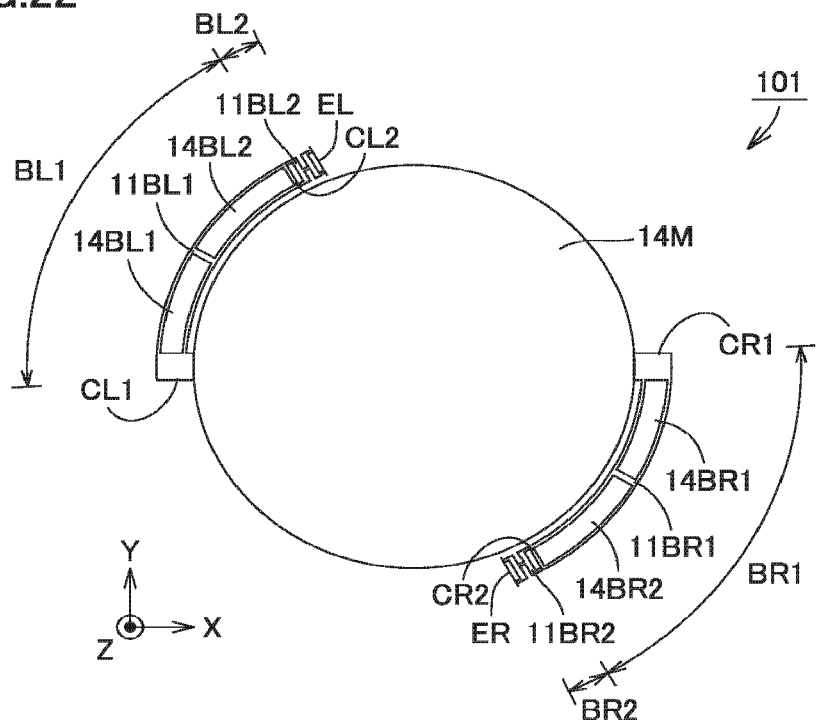
FIG. 22 is a schematic plan view showing an overall configuration of a mirror driving apparatus in a second example of Embodiment 1.

A description is given, using FIG. 22, of a configuration of a mirror driving apparatus in a second example of the present embodiment. Referring to FIG. 22, basically mirror driving apparatus 101 in the second example of the present embodiment has a similar configuration to that of mirror driving apparatus 100 in the first example, and therefore, the same component as that of mirror driving apparatus 100 is denoted by a similar reference character to that of mirror driving apparatus 100. As to the features of the second example similar to those of the first example, the description thereof is not repeated herein.

In mirror driving apparatus 101 in FIG. 22, first beam portions BL1, BR1 and second beam portions BL2, BR2 extend in the circumferential direction of circular reflective mirror 11M (reflective film 14M) as seen in plan view. In this respect, the configuration of mirror driving apparatus 101 differs from that of mirror driving apparatus 100 in which first beam portions BL1, BR1 and second beam portions BL2, BR2 extend linearly, i.e., radially in the radial direction of circular reflective mirror 11M (reflective film 14M) as seen in plan view.

In mirror driving apparatus 101, a pair of first beams includes: first beam 11BL1 adjacent to reflective mirror 11M in one direction from reflective mirror 11M, specifically leftward along the X direction; and first beam 11BR1 adjacent to reflective mirror 11M in the opposite direction from reflective mirror 11M, specifically rightward along the X direction. Second beam 11BL2 is adjacent to first beam 11BL1 and opposite to reflective mirror 11M with respect to first beam 11BL1, and second beam 11BR2 is adjacent to first beam 11BR1 and opposite to reflective mirror 11M with respect to first beam 11BR1. On the main surface of first beam 11BL1, upper electrodes 14BL1, 14BL2 are spaced from each other and piezoelectric films (not shown) are interposed between the upper electrodes and the main surface. On the main surface of first beam 11BR1, upper electrodes 14BR1, 14BR2 are spaced from each other and piezoelectric films (not shown) are interposed between the upper electrodes and the main surface. Elements such as upper electrodes 14BL1, 14BL2 also extend in the circumferential direction of reflective mirror 11M.

The basic operation of mirror driving apparatus 101 can be considered as similar to that of mirror driving apparatus 100. Specifically, first beams 11BL1, 11BR1 are displaceable in respective directions different from each other (opposite to each other) along the Z direction crossing the main surface which extends along the XY plane and over which upper electrode 14 is deposited. In contrast, the pair of second beams 11BL2, 11BR2 is displaceable in the direction connecting the pair of first beams 11BL1, 11BR1 and the pair of second beams 11BL2, 11BR2, along the main surface of second beams 11BL2, 11BR2, specifically in the direction along the circumferential direction of reflective mirror 11M. Reflective mirror 11M and first beam 11BL1 are directly adjacent to each other with first boundary portion CL1 in between, while reflective mirror 11M and first beam 11BR1 are directly adjacent to each other with first boundary portion CR1 in between. First boundary portions CL1, CR1 are displaceable in the Z direction crossing the main surface of first beams 11BL1, 11BR1. In contrast, second boundary portion CL2 between first beam 11BL1 and second beam 11BL2 and second boundary portion CR2 between first beam 11BR1 and second beam 11BR2 are displaceable in the direction along the main surface of second beams 11BL2, 11BR2, i.e., the circumferential direction.

As seen from the above, mirror driving apparatus 101 differs from mirror driving apparatus 100 in terms of the direction in which first and second beam portions BL1, BL2, BR1, BR2 extend and their shapes as seen in plan view. Other features of the configuration and the operation of these members are basically similar to those of mirror driving apparatus 100. The functions and effects of mirror driving apparatus 101 are therefore basically similar to those of mirror driving apparatus 100. It should be noted that the first and second beam portions of mirror driving apparatus 101 extend in a region close to the outer circumference of reflective mirror 11M, along the circumferential direction thereof. In this way, the size of mirror driving apparatus 101 as a whole as seen in plan view can be reduced relative to mirror driving apparatus 100.

Moreover, since the beam portions each extend in the circumferential direction, generation of large stress in regions adjacent to first boundary portions CL1, CR1 can be suppressed. In this way, deterioration of the flatness of reflective mirror 11M can be suppressed.

Embodiment 2

Figure 23:
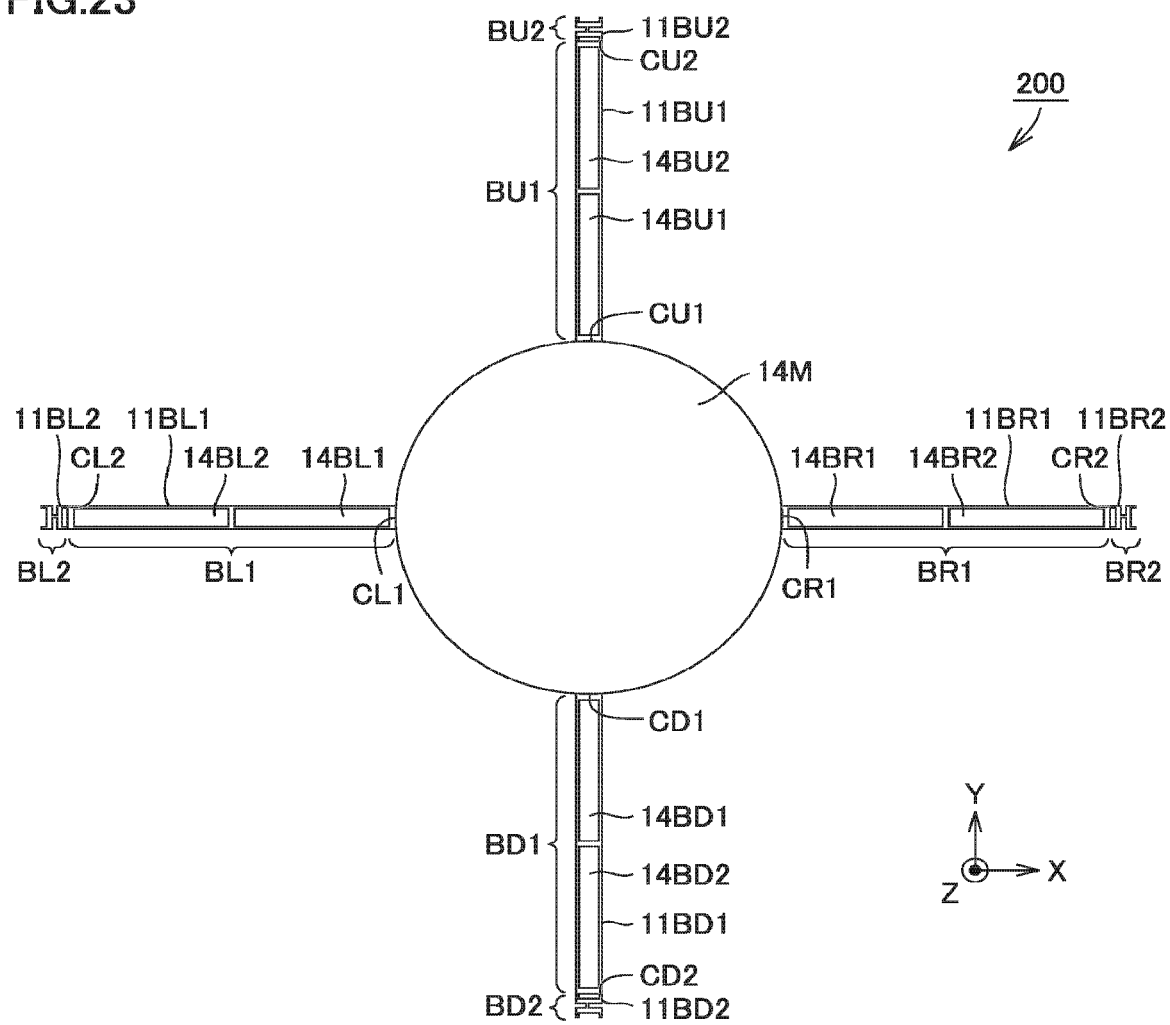
FIG. 23 is a schematic plan view showing an overall configuration of a mirror driving apparatus in a first example of Embodiment 2.

A description is given, using FIG. 23, of a configuration of a mirror driving apparatus in a first example of the present embodiment. Referring to FIG. 23, basically mirror driving apparatus 200 in the first example of the present embodiment has a similar configuration to that of mirror driving apparatuses 100, 101 in Embodiment 1, and therefore, the same component as that of mirror driving apparatuses 100, 101 is denoted by a similar reference character to that of mirror driving apparatuses 100, 101. As to the features of mirror driving apparatus 200 similar to those of mirror driving apparatuses 101, 102, the description thereof is not repeated herein.

Mirror driving apparatus 200 in FIG. 23 includes first and second beam portions that are specifically first beam portions BL1, BR1 and second beam portions BL2, BR2 extending in the X direction from reflective mirror portion M as seen in plan view, and additionally first beam portions BU1, BD1 and second beam portions BU2, BD2 extending in the Y direction from reflective mirror portion M as seen in plan view. In other words, mirror driving apparatus 200 includes, in addition to the components of mirror driving apparatus 101, a pair of first beam portions BU1, BD1 (a pair of beam portions) and a pair of second beam portions BU2, BD2 (a pair of beam portions).

Regarding mirror driving apparatus 200, the features of the configuration and the operation of first beam portions BL1, BR1 and second beam portions BL2, BR2 are similar to those of mirror driving apparatus 100 in Embodiment 1. Regarding mirror driving apparatus 200, the features of the configuration and the operation of first beam portions BU1, BD1 and second beam portions BU2, BD2 extending in the Y direction are similar to those of first beam portions BL1, BR1 and second beam portion BL2, BR2.

Specifically, first beam portion BU1 includes a first beam 11BU1, a lower electrode, a piezoelectric film, and upper electrodes 14BU1, 14BU2 similar to those of first beam portion BL1 (some of them are not shown). Likewise, first beam portion BD1 includes a first beam 11BD1, a lower electrode, a piezoelectric film, and upper electrodes 14BD1, 14BD2 similar to those of first beam portion BR1. Second beam portion BU2 includes a second beam 11BU2 similar to that of second beam portion BL2, and second beam portion BD2 includes a second beam 11BD2 similar to that of second beam portion BR2.

First beam 11BU1 which is one of the pair of first beams is adjacent to reflective mirror 11M in one direction from reflective mirror 11M, specifically upward along the Y direction, while the other first beam 11BD1 is adjacent to reflective mirror 11M in the other direction from reflective mirror B, specifically downward along the Y direction. Second beam 11BU2 is adjacent to first beam 11BU1 and opposite to reflective mirror 11M with respect to first beam 11BU1, while second beam 11BD2 is adjacent to first beam 11BD1 and opposite to reflective mirror 11M with respect to first beam 11BD1.

Regarding beam 11, reflective mirror 11M and first beam 11BU1 are directly adjacent to each other at first boundary portion CU1, while reflective mirror 11M and first beam 11BD1 are directly adjacent to each other at first boundary portion CD1. Moreover, regarding beam 11, first beam 11BU1 and second beam 11BU2 are directly adjacent to each other at second boundary portion CU2, while first beam 11BD1 and second beam 11BD2 are directly adjacent to each other at second boundary portion CD2.

First beams 11BU1, 11BD1 and first boundary portions CU1, CD1 are displaceable in respective directions different from each other (opposite to each other) along the Z direction crossing the main surface. Second beams 11BU2, 11BD2 and second boundary portions CU2, CD2 are displaceable along the Y direction connecting first beams 11BU1, 11BD1 and second beams 11BU2, 11BD2, along the main surface of second beams 11BU2, 11BD2.

As seen from the above, in the present embodiment, a plurality of rows each including a pair of first beams and a pair of second beams are arranged. Specifically, two rows, specifically a first row including a pair of first beams 11BL1, 11BR1 and a pair of second beams 11BL2, 11BR2, and a second row including a pair of first beams 11BU1, 11BD1 and a pair of second beams 11BU2, 11BD2 are included. Any number of these rows may be included. The first row extends linearly in the X direction, and the second row extends linearly in the Y direction. The first row and the second row thus cross each other (e.g., orthogonal to each other) as seen in plan view.

Mirror driving apparatus 200 in the present embodiment can be used to suppress deformation of reflective mirror 11M due to moment about the Y axis exerted on first and second beam portions BL1, BR1, BL2, BR2 extending in the X direction, and deformation of reflective mirror 11M due to moment about the X axis exerted on first and second beam portions BU1, BD1, BU2, BD2 extending in the Y direction. Moreover, voltage application to upper electrodes 14BU1, 14BU2, 14BD1, 14BD2 can be controlled independently of voltage application to upper electrodes 14BL1, 14BL2, 14BR1, 14BR2. It is therefore possible to control displacement of reflective mirror 11M about the Y axis independently of displacement of reflective mirror 11M about the X axis, and freely change the posture of reflective mirror 11M about any of the Y axis and the X axis. Accordingly, the direction in which incident light is reflected can be changed more freely as compared with Embodiment 1.

Figure 24:
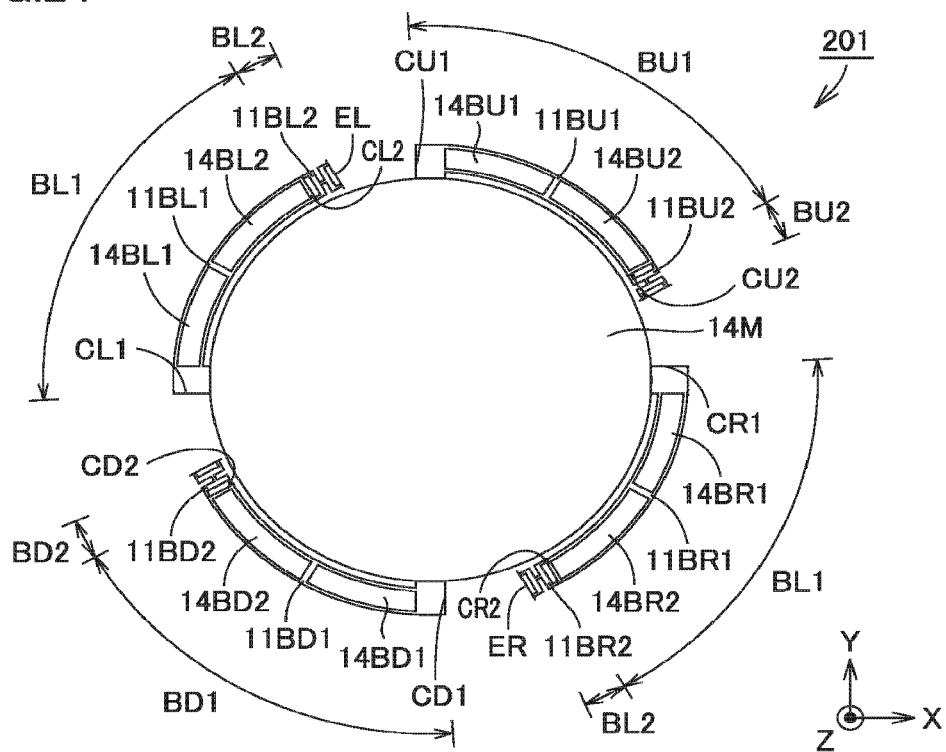
FIG. 24 is a schematic plan view showing an overall configuration of a mirror driving apparatus in a second example of Embodiment 2.

A description is given, using FIG. 24, of a configuration of a mirror driving apparatus in a second example of the present embodiment. Referring to FIG. 24, basically mirror driving apparatus 201 in the second example of the present embodiment has a similar configuration to that of mirror driving apparatus 200 in the first example, and therefore, the same component as that of mirror driving apparatus 200 is denoted by a similar reference character to that of mirror driving apparatus 200. As to the features of the second example similar to those of the first example, the description thereof is not repeated herein.

In mirror driving apparatus 201 in FIG. 24, first beam portions BL1, BR1, BU1, BD1 and second beam portions BL2, BR2, BU2, BD2 extend in the circumferential direction of circular reflective mirror 11M (reflective film 14M) as seen in plan view. In this respect, the configuration of mirror driving apparatus 201 differs from that of mirror driving apparatus 200 in which first beam portions BL1, BR1, BU1, BD1 and second beam portions BL2, BR2, BU2, BD2 extend linearly, i.e., radially in the radial direction of circular reflective mirror 11M (reflective film 14M) as seen in plan view.

First beam portions BL1, BR1 and second beam portions BL2, BR2 of mirror driving apparatus 201 are basically similar to those of mirror driving apparatus 101 in Embodiment 1, and therefore, the detailed description thereof is not repeated. First beam portions BU1, BD1 and second beam portions BU2, BD2 of mirror driving apparatus 201 are also basically similar to first beam portions BL1, BR1 and second beam portions BL2, BR2.

As described above, the features of the configuration and the operation of each beam portion of mirror driving apparatus 101 extending circumferentially are basically similar to those of each beam portion of mirror driving apparatus 100 extending linearly. Likewise, the features of the configuration and the operation of first beam portions BU1, BD1 and second beam portions BU2, BD2 of mirror driving apparatus 201 extending circumferentially are basically similar to those of first beam portions BU1, BD1 and second beam portions BU2, BD2 of mirror driving apparatus 200 extending linearly. The detailed description of the features of the configuration and the operation of first beam portions BU1, BD1 and second beam portions BU2, BD2 of mirror driving apparatus 201 is therefore not repeated.

Basically mirror driving apparatus 201 has both the functions and effects of mirror driving apparatus 101 and those of mirror driving apparatus 200. Specifically, the direction in which incident light is reflected can be changed more freely as compared with Embodiment 1 and the whole mirror driving apparatus 201 can be downsized. Meanwhile, deterioration of the flatness of reflective mirror 11M can also be suppressed.

The foregoing features of the embodiments (and examples included in the embodiments) may be applied in appropriate combination that meets technical consistency.

It should be construed that embodiments disclosed herein are given by way of illustration in all respects, not by way of limitation. It is intended that the scope of the present invention is defined by claims, not by the description above, and encompasses all modifications and variations equivalent in meaning and scope to the claims.

REFERENCE SIGNS LIST 10, 11S silicon layer; 11 beam; 11BL1, 11BR1, 11BU1, 11BD1 first beam; 11BL2, 11BR2, 11BU2, 11BD2 second beam; 11M reflective mirror; 12, 12BL1, 12BR1 lower electrode; 13, 13BL1, 13BL2, 13BR1, 13BR2 piezoelectric film; 14, 14BL1, 14BL2, 14BR1, 14BR2, 14BU1, 14BU2, 14BD1, 14BD2 upper electrode; 14M reflective film; 15 silicon oxide film layer; 20 SOI substrate; 100, 101, 200, 201 mirror driving apparatus; BL1, BR1, BU1, BD1 first beam portion; BL2, BR2, BU2, BD2 second beam portion; CL1, CR1, CU1, CD1 first boundary portion; CL2, CR2, CU2, CD2 second boundary portion; EL left end; ER right end; M reflective mirror portion

The invention claimed is:
1. A mirror driving apparatus comprising:
a reflector capable of reflecting incident light; and
a pair of beam portions adjacent to the reflector to sandwich the reflector between the beam portions as seen in plan view, wherein
the pair of beam portions includes:
a pair of first beams directly adjacent to the reflector to sandwich the reflector between the first beams; and a pair of second beams each coupled to one side of a corresponding one of the first beams, the one side being opposite to the reflector with respect to the corresponding one of the first beams;
a plurality of electrodes are spaced from each other on a main surface of each of the pair of first beams, a piezoelectric material being interposed between the main surface and the plurality of electrodes,
the first beams of the pair of first beams are displaceable crosswise to the main surface in respective directions opposite to each other,
first boundary portions directly adjacent to the reflector and directly adjacent to the pair of first beams are displaceable crosswise to the main surface, and the pair of first beams is smaller in width than the reflector,
the pair of second beams is displaceable in a direction connecting the pair of first beams and the pair of second beams, along a main surface of the second beams,
respective voltages of opposite polarities are applicable to a first electrode and a second electrode of the plurality of electrodes, the first electrode being located at a smaller distance from the reflector than a distance between the second electrode and the reflector, the second electrode being adjacent to the first electrode,
the reflector is configured to be inclined about an axis by deformation of the piezoelectric material caused by the voltages, the axis being orthogonal to a line connecting the reflector and the first boundary portions between the reflector and the pair of first beams,
respective voltages identical in absolute value and opposite in polarity to each other are applied to the first electrode for one first beam of the pair of first beams and the first electrode for the other first beam of the pair of first beams, the one first beam being different from the other first beam,
respective voltages identical in absolute value and opposite in polarity to each other are applied to the second electrode for the one first beam of the pair of first beams and the second electrode for the other first beam of the pair of first beams,
a plurality of rows each including the pair of first beams and the pair of second beams are arranged, and
a first row and a second row that are included in the plurality of rows are arranged to cross each other as seen in plan view.

2. The mirror driving apparatus according to claim 1, wherein
at the first boundary portions, the reflector is directly adjacent to the pair of first beams, and
the first boundary portions are displaceable following displacement of the pair of first beams.

3. A mirror driving apparatus comprising:
a reflector capable of reflecting incident light; and
a pair of beam portions adjacent to the reflector to sandwich the reflector between the beam portions as seen in plan view, wherein
the pair of beam portions includes:
a pair of first beams directly adjacent to the reflector to sandwich the reflector between the first beams; and
a pair of second beams each coupled to one side of a corresponding one of the first beams, the one side being opposite to the reflector with respect to the corresponding one of the first beams:
a plurality of electrodes are spaced from each other on a main surface of each of the pair of first beams, a piezoelectric material being interposed between the main surface and the plurality of electrodes,
the first beams of the pair of first beams are displaceable crosswise to the main surface in respective directions opposite to each other,
first boundary portions directly adjacent to the reflector and directly adjacent to the pair of first beams are displaceable crosswise to the main surface, and the pair of first beams is smaller in width than the reflector,
the pair of second beams is displaceable in a direction connecting the pair of first beams and the pair of second beams, along a main surface of the second beams,
respective voltages of opposite polarities are applicable to a first electrode and a second electrode of the plurality of electrodes, the first electrode being located at a smaller distance from the reflector than a distance between the second electrode and the reflector, the second electrode being adjacent to the first electrode,
the reflector is configured to be inclined about an axis by deformation of the piezoelectric material caused by the voltages, the axis being orthogonal to a line connecting the reflector and the first boundary portions between the reflector and the pair of first beams,
respective voltages identical in absolute value and opposite in polarity to each other are applied to the first electrode for one first beam of the pair of first beams and the first electrode for the other first beam of the pair of first beams, the one first beam being different from the other first beam,
respective voltages identical in absolute value and opposite in polarity to each other are applied to the second electrode for the one first beam of the pair of first beams and the second electrode for the other first beam of the pair of first beams,
a plurality of rows each including the pair of first beams and the pair of second beams are arranged, and
a first row and a second row that are included in the plurality of rows are arranged to cross each other as seen in plan view,
wherein the reflector is inclined by an electric field applied to the piezoelectric material to satisfy $$\theta 1 = \alpha \cdot \theta 2$$

wherein $\theta 1$ is a central angle of an arc formed by a region overlapping the first electrode as seen in plan view as a result of voltage application to the first electrode, and $\theta 2$ is a central angle of an arc formed by a region overlapping the second electrode as seen in plan view as a result of voltage application to the second electrode, and
a value of $\alpha$ is determined depending on a ratio of a dimension of the reflector to a dimension of a corresponding one of the pair of first beams, the value of a being determined as a coefficient minimizing an angle error under a dimension condition in a direction in which the reflector and the pair of first beams are arranged.

4. A method for manufacturing a mirror driving apparatus, comprising:
forming a reflector capable of reflecting incident light; and
forming a pair of beam portions adjacent to the reflector to sandwich the reflector between the beam portions as seen in plan view, wherein
the pair of beam portions includes:
a pair of first beams directly adjacent to the reflector to sandwich the reflector between the first beams; and
a pair of second beams each coupled to one side of a corresponding one of the first beams, the one side being opposite to the reflector with respect to the corresponding one of the first beams, a plurality of electrodes are spaced from each other on a main surface of each of the pair of first beams, a piezoelectric material being interposed between the main surface and the plurality of electrodes, the first beams of the pair of first beams are displaceable crosswise to the main surface in respective directions opposite to each other, first boundary portions directly adjacent to the reflector and directly adjacent to the pair of first beams are displaceable crosswise to the main surface, and the pair of first beams is smaller in width than the reflector, the pair of second beams is displaceable in a direction connecting the pair of first beams and the pair of second beams, along a main surface of the second beams, respective voltages of opposite polarities are applicable to a first electrode and a second electrode of the plurality of electrodes, the first electrode being located at a smaller distance from the reflector than a distance between the second electrode and the reflector, the second electrode being adjacent to the first electrode, the reflector is configured to be inclined about an axis by deformation of the piezoelectric material caused by the voltages, the axis being orthogonal to a line connecting the reflector and the first boundary portions between the reflector and the pair of first beams, respective voltages identical in absolute value and opposite in polarity to each other are applied to the first electrode for one first beam of the pair of first beams and the first electrode for the other first beam of the pair of first beams, the one first beam being different from the other first beam, respective voltages identical in absolute value and opposite in polarity to each other are applied to the second electrode for the one first beam of the pair of first beams and the second electrode for the other first beam of the pair of first beams, a plurality of rows each including the pair of first beams and the pair of second beams are arranged, and a first row and a second row that are included in the plurality of rows are arranged to cross each other as seen in plan view.

5. The method for manufacturing a mirror driving apparatus according to claim 4, wherein the reflector, the first beams, and the second beams are formed as a single unit.

* * * * *